US012740383B2

(12) United States Patent
Huang et al.

(10) Patent No.: US 12,740,383 B2
(45) Date of Patent: Sep. 15, 2026

(54) SEMICONDUCTOR DEVICE INCLUDING A METAL OXIDE INTERFACE LAYER AND METHODS FOR FORMING THE SAME

(71) Applicant: Taiwan Semiconductor Manufacturing Company Limited, Hsinchu (TW)

(72) Inventors: Yen-Chieh Huang, Hsinchu (TW); Huai-Ying Huang, Jhonghe City (TW); Wei-Gang Chiu, New Taipei City (TW); Yu-Chuan Shih, Hsinchu City (TW); Chun-Chieh Lu, Taipei City (TW); Yu-Ming Lin, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 569 days.

(21) Appl. No.: 18/346,925

(22) Filed: Jul. 5, 2023

(65) Prior Publication Data

US 2025/0014945 A1 Jan. 9, 2025

(51) Int. Cl.
*H10W 20/00* (2026.01)
*H10B 51/10* (2023.01)
(Continued)

(52) U.S. Cl.
CPC .......... *H10W 20/023* (2026.01); *H10B 51/10* (2023.02); *H10B 51/30* (2023.02);
(Continued)

(58) Field of Classification Search
CPC ........... H10D 30/0128; H10D 30/0135; H10D 30/0144; H10D 30/0149; H10D 30/0415;
(Continued)

(56) References Cited

U.S. PATENT DOCUMENTS 12,089,415 B2 * 9/2024 Huang .................. H10B 51/30
2015/0048359 A1 * 2/2015 Fukase ................ H10D 30/673
257/43
(Continued)

FOREIGN PATENT DOCUMENTS

CN 114361026 A 4/2022
CN 115360233 A * 11/2022 ........... H10D 64/693
(Continued)

OTHER PUBLICATIONS

Jianq Chyun Intellectual Property Office; TW Application No. 112133188; Office Action dated May 1, 2024; 16 pages.

*Primary Examiner* — Matthew E Warren
(74) *Attorney, Agent, or Firm* — The Marbury Law Group, PLLC

(57) ABSTRACT

A device structure can be formed by forming a layer stack comprising a continuous bottom electrode material layer, a continuous dielectric layer, and a continuous dielectric metal oxide layer; increasing an oxygen-to-metal ratio in a top surface portion of the continuous dielectric metal oxide layer by incorporating oxygen atoms into the top surface portion of the continuous dielectric metal oxide layer; depositing a continuous semiconductor layer over the continuous dielectric metal oxide layer; and patterning the continuous semiconductor layer and the layer stack to form a patterned layer stack including a bottom electrode, a dielectric layer, a dielectric metal oxide layer, and a semiconductor layer.

20 Claims, 33 Drawing Sheets

(51) Int. Cl.

| | |
|---|---|
| ***H10B 51/30*** | (2023.01) |
| ***H10B 53/10*** | (2023.01) |
| ***H10B 53/30*** | (2023.01) |
| ***H10D 30/01*** | (2025.01) |
| ***H10D 64/68*** | (2025.01) |

(52) U.S. Cl.
CPC ............. *H10B 53/10* (2023.02); *H10B 53/30* (2023.02); *H10D 30/0415* (2025.01); *H10D 64/689* (2025.01); *H10W 20/096* (2026.01)

(58) Field of Classification Search
CPC .. H10D 30/701; H10D 30/689; H10D 30/691; H10D 64/689; H10W 20/023; H10W 20/096; H10B 51/10; H10B 51/30; H10B 3/10
See application file for complete search history.

(56) References Cited

U.S. PATENT DOCUMENTS

| | | | | |
|---|---|---|---|---|
| 2021/0083122 | A1* | 3/2021 | Naylor | H10D 30/6755 |
| 2021/0376164 | A1* | 12/2021 | Wu | H10D 64/258 |
| 2021/0399137 | A1* | 12/2021 | Wang | H10D 64/033 |
| 2022/0352379 | A1* | 11/2022 | Lin | H10D 99/00 |

FOREIGN PATENT DOCUMENTS

| | | | | |
|---|---|---|---|---|
| TW | 201840019 | A | 11/2018 | |
| TW | 202243262 | A | 11/2022 | |
| WO | WO-2021090116 | A1 * | 5/2021 | H10D 99/00 |

* cited by examiner

A'
A
90
86
90
92
96
923
922
921
hd1
hd2

80
86
82
60
66
62
56
300
90
92
96
923
922
921
70
72
76
723
722
721
50
30
24
22
20
15
12
628
620
52
41
40
28

A
A'
56
276
50
276
hd1
hd2

240
270
276
272
40
28
50
30
24
20
22
15
628
620
12
56

A'
56
276
50
276
A
hd2
hd1
240
270
272
40
28
20
24
22
230
15
628
620
12
56

A'
56
276
322
276
A
hd2
hd1

322
324
320
430
340
270
276
272
270
276
272
40
28
50
30
24
20
22
56
15
12
628
620

SEMICONDUCTOR DEVICE INCLUDING A METAL OXIDE INTERFACE LAYER AND METHODS FOR FORMING THE SAME

BACKGROUND

In ferroelectric devices, direct contact between a ferroelectric material and a semiconductor channel material may result in poor interface quality. Such poor interface quality may result in a high density of defects, which reduces device reliability. Further, a high electrical field may cause interfacial breakdown between the ferroelectric material and the semiconductor channel. In addition, compound semiconductor materials such as indium gallium zinc oxide have low bond dissociation energy. These materials may be prone to bond breaking and formation of new bonds with hydrogen, thereby reducing device reliability. Additional reliability problems such as bias temperature instability (BTI) and lower endurance characteristics may result from poor interface between a ferroelectric material and a semiconductor channel in ferroelectric devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
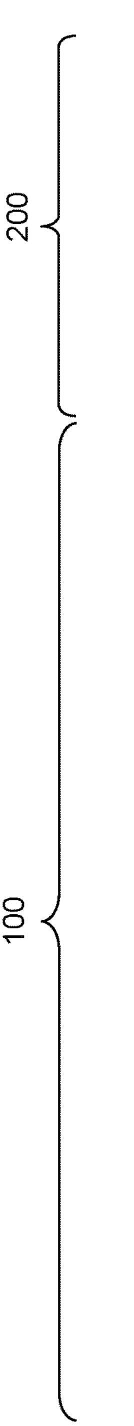
FIG. 1 is a vertical cross-sectional view of an first exemplary structure after formation of complementary metal-oxide-semiconductor (CMOS) transistors, first metal interconnect structures formed in lower-level dielectric material layers, and an isolation dielectric layer according to an embodiment of the present disclosure.
Figure 1:
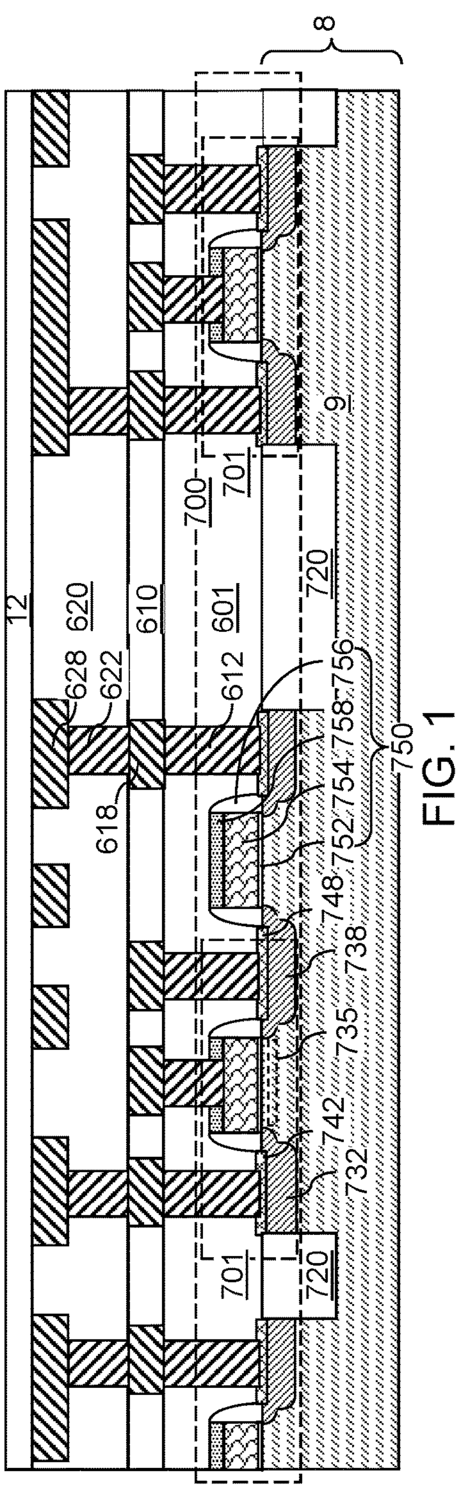

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Same reference numerals refer to the same element or similar elements, and a same material composition and a same function are presumed for elements with the same reference numeral unless otherwise stated explicitly.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor device including a thin film transistor. The present disclosure enhances performance of a semiconductor device by providing a dielectric metal oxide layer between an electrode and a semiconductor layer of a thin film transistor. The dielectric metal oxide layer may be formed by physical vapor deposition, and compositionally modified to enrich oxygen, i.e., to increase the oxygen-to-metal ratio therein. A superior interface may be provided between the ferroelectric material layer that functions as a component of a gate dielectric for the thin film transistor, and the semiconductor layer that functions as the channel of the thin film transistor. Interfacial defects may be reduced, and device reliability may be enhanced in the ferroelectric memory element of the present disclosure. Further, the magnitude of the electrical field may be reduced between the ferroelectric material layer and the semiconductor layer, and the probability of interfacial breakdown may be reduced to provide enhanced endurance of the ferroelectric memory element. By utilizing a different metal oxide material, the present invention eliminates the weaknesses associated with IGZO metal oxide, resulting in improved device reliability.

Referring to FIG. 1, an first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of ferroelectric devices may be subsequently formed. The first exemplary structure may further include a peripheral region 200 in which metal wiring for the array of ferroelectric devices is provided. Generally, the field effect transistors 701 in the CMOS circuitry 700 may be electrically connected to an electrode of a respective ferroelectric device by a respective set of metal interconnect structures.

Devices (such as field effect transistors 701) in the peripheral region 200 may provide functions that operate the array of ferroelectric devices to be subsequently formed. Specifically, devices in the peripheral region may be configured to control the programming operation, the erase operation, and the sensing (read) operation of the array of ferroelectric devices. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. In embodiments in which the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric device (e.g., ferroelectric memory cell) and to control gate voltages of thin film transistors to be subsequently formed. In this embodiment, the programming control circuit may be configured to provide a first programming pulse that programs a respective ferroelectric dielectric material layer in a selected ferroelectric device into a first polarization state in which electrical polarization in the ferroelectric dielectric material layer points toward a first electrode of the selected ferroelectric device, and to provide a second programming pulse that programs the ferroelectric dielectric material layer in the selected ferroelectric device into a second polarization state in which the electrical polarization in the ferroelectric dielectric material layer points toward a second electrode of the selected ferroelectric device.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^5$ S/cm upon suitable doping with an electrical dopant.

According to an aspect of the present disclosure, the field effect transistors 701 may be subsequently electrically connected to drain electrodes and gate electrodes of access transistors including compound semiconductor plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contacting a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-level dielectric material layers, or first dielectric material layers. The metal interconnect structures (612, 618, 622, 628) formed within in the lower-level dielectric material layers are herein referred to as lower-level metal interconnect structures, or first metal interconnect structures.

An array of ferroelectric devices may be subsequently formed over the first dielectric material layers (601, 610, 620). While the present disclosure is described using an embodiment in which an array of ferroelectric devices may be formed over two metal line levels of first metal interconnect structures (612, 618, 622, 628), embodiments are expressly contemplated herein in which the array of ferroelectric devices are formed over a different number of metal line levels. A via level is provided between each vertically neighboring pair of metal line levels, and a contact level is provided underneath the bottommost metal line level, i.e., underneath the first metal line level. Thus, the first metal interconnect structures may generally include one metal line level, two metal line levels, three metal line levels, or four or more metal line levels.

A dielectric material layer may be formed above the first dielectric material layers (601, 610, 620). Connection via structures for ferroelectric devices may be subsequently formed through this dielectric material layer, and as such, this dielectric material layer is herein referred to as a connection-via-level dielectric layer 12. The connection-via-level dielectric layer 12 includes an insulating material such as undoped silicate glass, a doped silicate glass, silicon oxynitride, silicon nitride, silicon carbide nitride, organosilicate glass, or a combination or a stack thereof. The thickness of the connection-via-level dielectric layer 12 may be in a range from 10 nm to 300 nm, such as from 30 nm to 100 nm, although lesser and greater thicknesses may also be used. Generally, the connection-via-level dielectric layer 12 may be formed over the first metal interconnect structures (612, 618, 622, 628).

Figure 2B:
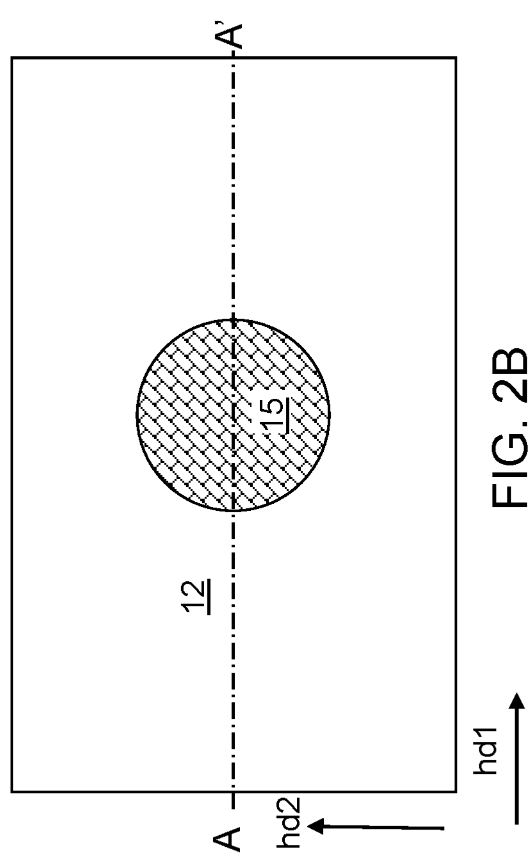
FIG. 2B is a top-down view of the region of the first exemplary structure of FIG. 2A. The vertical plane A-A' in FIG. 2B is the cut plane of the vertical cross-sectional view of FIG. 2A.
Figure 2A:
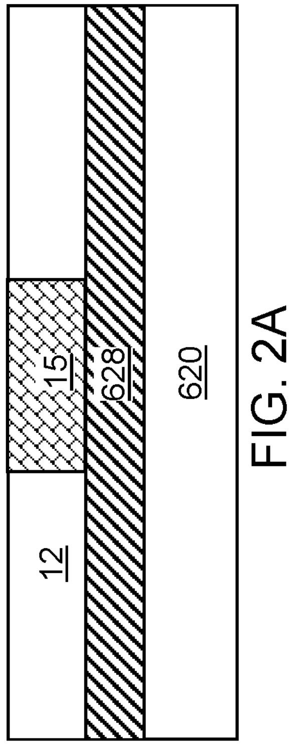
FIG. 2A is a vertical cross-sectional view of a region of the first exemplary structure after formation of a connection via structure according to an embodiment of the present disclosure.

Referring to FIGS. 2A and 2B, a connection via cavity may be formed through the connection-via-level dielectric layer 12 in each area of a ferroelectric devices over a respective underlying metal line (such as a respective underlying second metal line structure 628). A top surface of the respective underlying metal line may be physically exposed at the bottom of each of the connection via cavities.

At least one metallic material may be deposited in the connection via cavities. The at least one metallic material may comprise, for example, a combination of a metallic barrier liner layer (not expressly shown) and a metallic fill material layer (not expressly shown). In an illustrative example, the metallic barrier liner layer may comprise a metallic barrier material such as TiN, TaN, WN, MON, Ti, Ta, W, TiC, TaC, WC, or a combination thereof, and the metallic fill material layer may comprise a high electrical-conductivity metallic material such as Cu, W, Ru, Mo, Co, etc. Other suitable metallic barrier liner and metallic fill materials are within the contemplated scope of disclosure.

Excess portions of the at least one metallic material may be removed from above the horizontal plane including the top surface of the connection-via-level dielectric layer 12 by a planarization process, which may use a chemical mechanical polishing (CMP) process and/or a recess etch process. Each remaining portion of the at least one metallic material filling a respective connection via cavity constitutes a connection via structure 15. Generally, the connection via structures 15 may be formed in the connection-via-level dielectric layer 12, and may contact a top surface of one of the first metal interconnect structures (612, 618, 622, 628). The connection via structures 15 may have top surfaces located within a horizontal plane including the top surface of the connection-via-level dielectric layer 12. In one embodiment, an array of the connection via structures 15 may be arranged as a two-dimensional periodic array that is repeated along the first horizontal direction hd1 with a first pitch, and is repeated along the second horizontal direction hd2 with a second pitch.

Figure 3B:
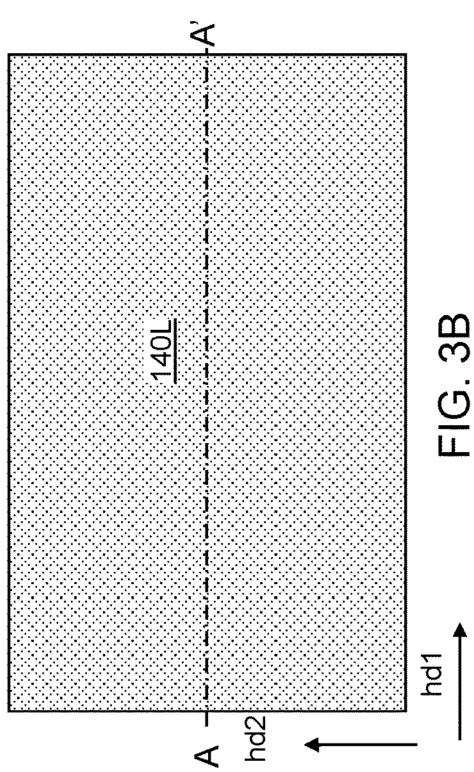
FIG. 3B is a top-down view of the region of the first exemplary structure of FIG. 3A. The vertical plane A-A' in FIG. 3B is the cut plane of the vertical cross-sectional view of FIG. 3A.
Figure 3A:
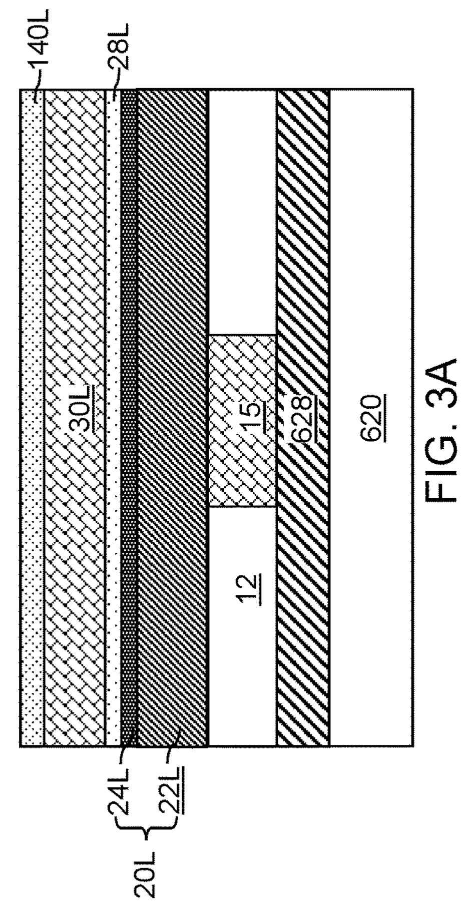
FIG. 3A is a vertical cross-sectional view of a region of the first exemplary structure after formation of a continuous bottom electrode material layer, a continuous ferroelectric material layer, and a continuous metal layer according to an embodiment of the present disclosure.

Referring to FIGS. 3A and 3B, a layer stack (20L, 28L, 30L, 140L) may be formed by sequentially depositing a set of layers that include a continuous bottom electrode material layer 20L, an optional continuous seed layer 28L, a continuous ferroelectric material layer 30L, and a continuous metal layer 140L.

The continuous bottom electrode material layer 20L comprises a layer stack including, from bottom to top, a continuous primary metal layer 22L and a continuous metallic barrier capping layer 24L. The continuous primary metal layer 22L comprises a highly conductive metal having a lower electrical resistivity than the material of the continuous metallic barrier capping layer 24L. The continuous primary metal layer 22L may comprise a metal such as Co, W, Mo, Ru, Co, etc., and may have a thickness in a range from 50 nm to 200 nm, although lesser and greater thicknesses may also be used. The continuous metallic barrier capping layer 24L may have a higher electrical resistivity than the continuous primary metal layer 22L, and may function as a diffusion barrier material for metallic elements, hydrogen, oxygen, and moisture. In one embodiment, the continuous metallic barrier capping layer 24L comprises a material selected from Ti, Ta, W, Mo, TiN, TaN, WN, MON, TIC, TaC, and WC, and has a thickness in a range from 5 nm to 50 nm, although lesser and greater thicknesses may also be used. Other suitable materials are within the contemplated scope of disclosure.

Some embodiments may include an optional continuous seed layer 28L that comprises a dielectric metal oxide material that may facilitate growth of the ferroelectric dielectric material of the continuous ferroelectric material layer 30L. The continuous seed layer 28L may comprise, for example, an optional metal seed layer (not separately shown) consisting essentially of an elemental metal (such as Ta, Zr, Hf, etc.) and a dielectric seed layer (not separately shown) including a dielectric metal oxide material such as tantalum oxide, zirconium oxide, hafnium oxide, titanium oxide, barium oxide, strontium oxide, yttrium oxide, hafnium silicate, etc. The thickness of the continuous seed layer 28L may be in a range from 0.1 nm to 10 nm, such as from 0.3 nm to 3 nm, although lesser and greater thicknesses may also be used. Generally, an optional metal layer and a dielectric metal oxide layer may be used for the continuous seed layer 28L provided that the continuous seed layer 28L decreases the interfacial energy at the top surface for deposition of the continuous ferroelectric material layer 30L thereupon. Thus, use of the continuous seed layer 28L may reduce the surface roughness of the material layers to be subsequently formed by facilitating uniform nucleation.

The continuous ferroelectric material layer 30L comprises, and/or consists essentially of, a ferroelectric material. Generally, any ferroelectric material known in the art may be used for the continuous ferroelectric material layer 30L. For example, the continuous ferroelectric material layer 30L comprises, and/or consists essentially of, a ferroelectric dielectric material such as titanium oxide ($TiO_2$), lead zirconate titanate ($Pb[Zr,Ti]O_3$ or PZT), barium titanate ($BaTiO_3$), lead titanate ($PbTiO_3$), lithium niobate ($LiNbO_3$), strontium titanate ($SrTiO_3$), potassium niobate ($KNbO_3$), sodium potassium niobate ($NaNbO_3$—$KNbO_3$ or NKN), bismuth titanate ($Bi_4Ti_3O_{12}$ or BIT), lithium tantalate ($LiTaO_3$), potassium titanyl phosphate ($KTiOPO_4$ or KTP), lanthanum-doped lead zirconate titanate ($Pb_{1-x}La_x[Zr,Ti]O_3$ or PLZT), sodium tungstate ($Na_2WO_4$), calcium copper titanate ($CaCu_3Ti_4O_{12}$ or CCTO), potassium sodium bismuth titanate ($K_{0.5}Na_{0.5}Bi_4Ti_4O_{15}$ or KNBT), and doped derivatives thereof. In one embodiment, the continuous ferroelectric material layer 30L comprises, and/or consists essentially of, a doped hafnium oxide layer that is doped with at least one dopant species that is selected from Al, In, Si, Ge, alkaline earth metals (Mg, Sr, etc.), transition metals (Zr, Ta, etc.), and rare-earth metals (Y, Gd, La, etc.). In one embodiment, the continuous ferroelectric material layer 30L comprises, and/or consists essentially of, a tantalum-doped hafnium oxide layer. The thickness of the continuous ferroelectric material layer 30L may be in a range from 1 nm to 100 nm, although lesser and greater thicknesses may also be used.

The continuous metal layer 140L may be subsequently formed over the continuous ferroelectric material layer 30L. According to an aspect of the present disclosure, the continuous metal layer 140L may be deposited by physical vapor deposition. A physical vapor deposition process may deposit metal at a deposition rate of about 0.3 nm/sec. As such, deposition of a metal layer having a thickness in a range from 1.5 nm to 6 nm takes only about 5 second to 20 second, and the continuous metal layer 140L may be formed at a high throughput in mass manufacturing environment. The continuous metal layer 140L may comprise, and/or may consist essentially of, at least one metal that forms a dielectric metal oxide upon oxidation. In one embodiment, the continuous metal layer 140L may comprise, and/or may consist essentially of, at least one metal that is selected from titanium, hafnium, zirconium, a lanthanum-hafnium alloy, a lanthanum-hafnium-zirconium alloy, lanthanum, a hafnium-silicon alloy, a hafnium-aluminum alloy, an erbium-titanium alloy, a strontium-titanium alloy, a lanthanum-scandium alloy, a lanthanum-aluminum alloy, a gadolinium-scandium alloy, a lanthanum-lutetium alloy, gadolinium, a lanthanum-silicon alloy, a strontium-hafnium alloy, cerium, beryllium, indium, gallium, aluminum, tin, vanadium, tungsten, zirconium, or niobium. Alternatively, the continuous metal layer 140L may be replaced with a semiconductor material such as silicon or with a nitride material such as hafnium nitride.

Deposition of a metal oxide employing plasma-enhanced atomic layer deposition process uses many cycles of a combination of a metal-precursor gas exposure step and an oxidation step. For example, deposition of titanium oxide using plasma-enhanced atomic layer deposition uses about 50 cycles of a combination of a titanium-precursor gas exposure step and an oxidation step to grow 3 nm to titanium oxide. Thus, deposition of the continuous metal layer 140L and subsequent oxidation of the continuous metal layer 140L into a continuous dielectric metal oxide layer may be less time-consuming and more economical as compared to growth of a metal oxide using other deposition processes. The thickness of the continuous metal layer 140L may be in a range from 1.5 nm to 6 nm, such as from 2 nm and 4 nm, although lesser and greater thicknesses may also be used.

Figures 4A, 4B:
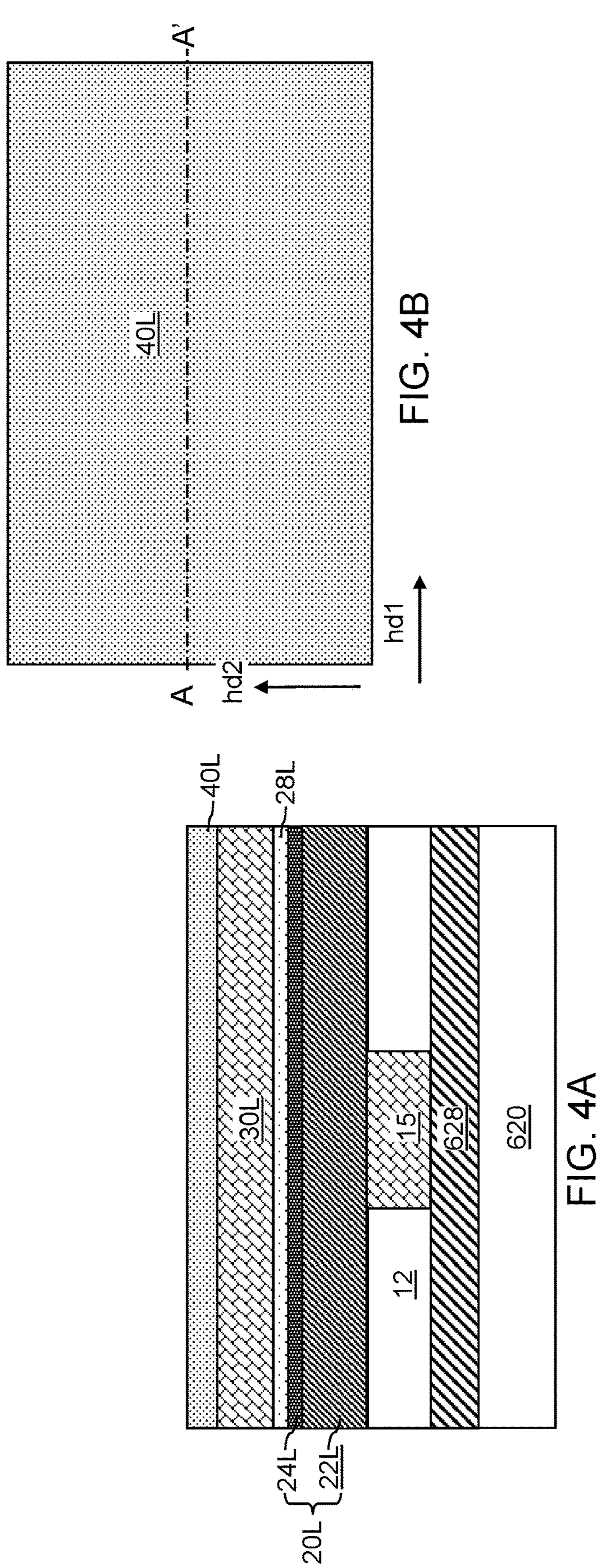
FIG. 4A is a vertical cross-sectional view of a region of the first exemplary structure after converting the continuous metal layer into a continuous dielectric metal oxide layer according to an embodiment of the present disclosure.
FIG. 4B is a top-down view of the region of the first exemplary structure of FIG. 4A. The vertical plane A-A' in FIG. 4B is the cut plane of the vertical cross-sectional view of FIG. 4A.

Referring to FIGS. 4A and 4B, the continuous metal layer 140L may be converted into a continuous dielectric metal oxide layer 40L by performing an oxidation process that introduces oxygen atoms from an ambient into the continuous metal layer 140L.

In one embodiment, the oxidation process may comprise a thermal anneal in an oxidizing ambient at an elevated temperature in a range from 200 degrees Celsius to 400 degrees Celsius. In this embodiment, conversion of the continuous metal layer 140L into the continuous dielectric metal oxide layer 40L may comprise performing a thermal anneal in an oxidizing ambient at an elevated temperature in a range from 200 degrees Celsius to 400 degrees Celsius. The oxidizing ambient may include oxygen, ozone, nitrous oxide, nitric oxide, or water vapor at a partial pressure in a range from 1 mTorr to 20 atmospheric pressure, such as from 1 Torr to 1 atmospheric pressure. The duration of the oxidation process may be in a range from 1 minute to 120 minutes, although shorter and longer durations may also be used.

In one embodiment, the oxidation process may comprise an ozonated deionized water treatment process for a duration in a range from 60 seconds to 600 seconds. In this embodiment, conversion of the continuous metal layer 140L into the continuous dielectric metal oxide layer 40L may comprise performing an ozonated deionized water treatment process for a duration in a range from 60 seconds to 600 seconds. Ozonated deionized water (DI-$O_3$ water) includes ozone within deionized water, and functions as a strong wet oxidizer. Upon immersion of the first exemplary structure into a bath including ozonated deionized water, oxygen atoms dissociated from ozone molecules may diffuse through into the continuous metal layer 140L and converts the titanium within the continuous metal layer 140L into titanium oxide. In one embodiment, the temperature of the ozonated deionized water may be raised to accelerate the oxidation process.

In one embodiment, the oxidation process may comprise a direct ozone plasma treatment in a plasma process chamber. In this embodiment, conversion of the continuous metal layer 140L into the continuous dielectric metal oxide layer 40L may comprise performing a direct ozone plasma treatment in a plasma process chamber. The ozone plasma generates oxygen atoms, which subsequently diffuse into the continuous metal layer 140L and converts the continuous metal layer 140L into the continuous dielectric metal oxide layer 40L. The radio-frequency (RF) power and the duration of the direct ozone plasma treatment process may be selected to ensure diffusion of sufficient number of oxygen atoms toward the interface with the continuous ferroelectric material layer 30L. In one embodiment, the direct ozone plasma treatment process may be performed in a plasma process chamber.

The continuous dielectric metal oxide layer 40L may comprise, and/or may consist essentially of, titanium oxide, hafnium oxide, zirconium oxide, lanthanum hafnium oxide, lanthanum hafnium zirconium oxide, lanthanum oxide, hafnium silicate, hafnium aluminum oxide, erbium titanium oxide, strontium titanium oxide, lanthanum scandium oxide, lanthanum aluminum oxide, gadolinium scandium oxide, lanthanum lutetium oxide, gadolinium oxide, lanthanum silicate, strontium hafnium oxide, cerium oxide, beryllium oxide, indium oxide, gallium oxide, aluminum oxide, tin oxide, vanadium oxide, tungsten oxide, niobium oxide, tantalum oxide, and metal-rich variants thereof. In some embodiment, the continuous dielectric metal oxide layer 40L may be replaced with a silicon oxide layer or a hafnium oxynitride layer.

Figure 5A:
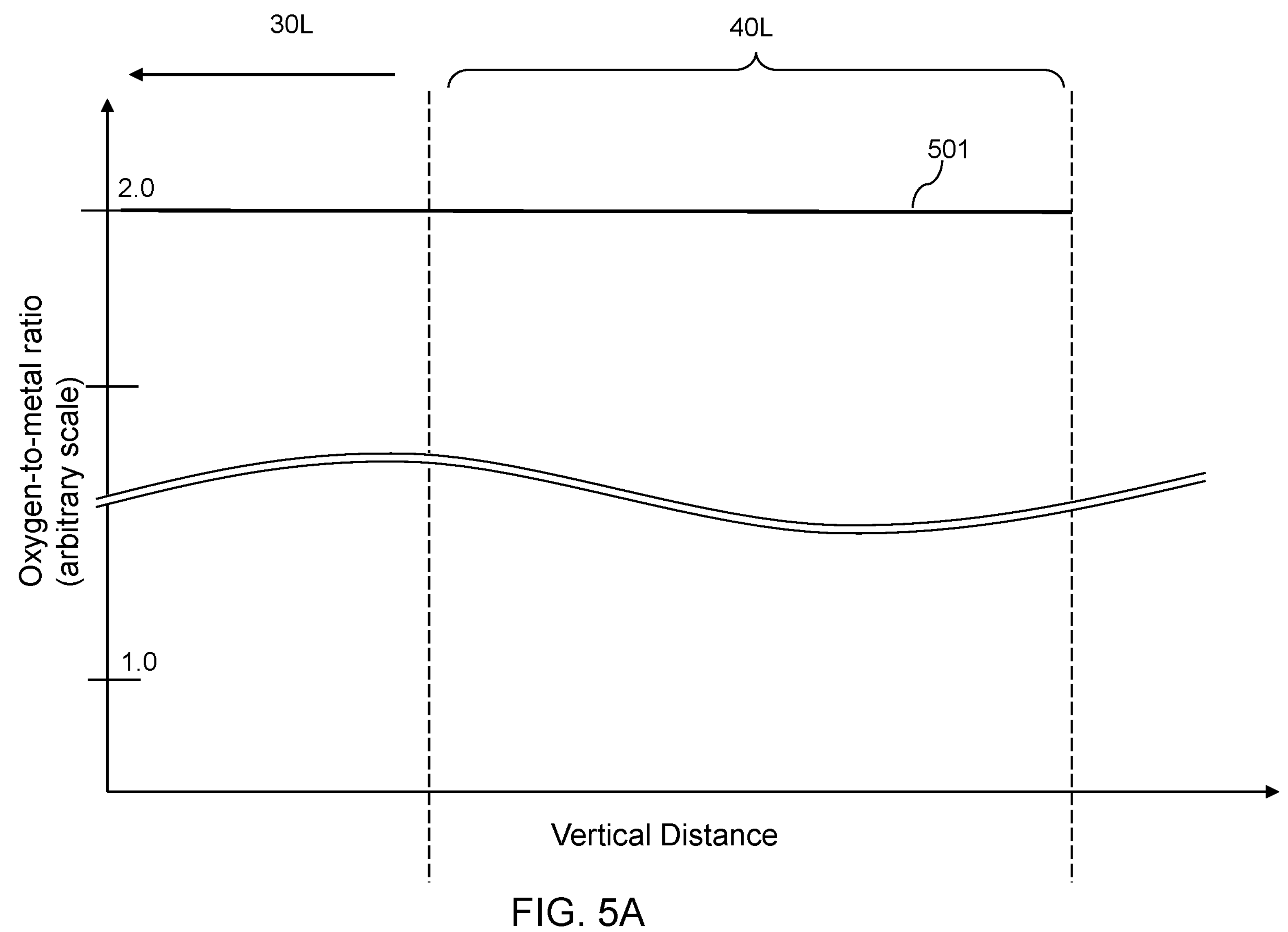
FIGS. 5A-5C are exemplary oxygen-to-metal ratio profiles in the continuous dielectric metal oxide layer after performing the oxidation process according to various embodiments of the present disclosure.
Figure 5B:
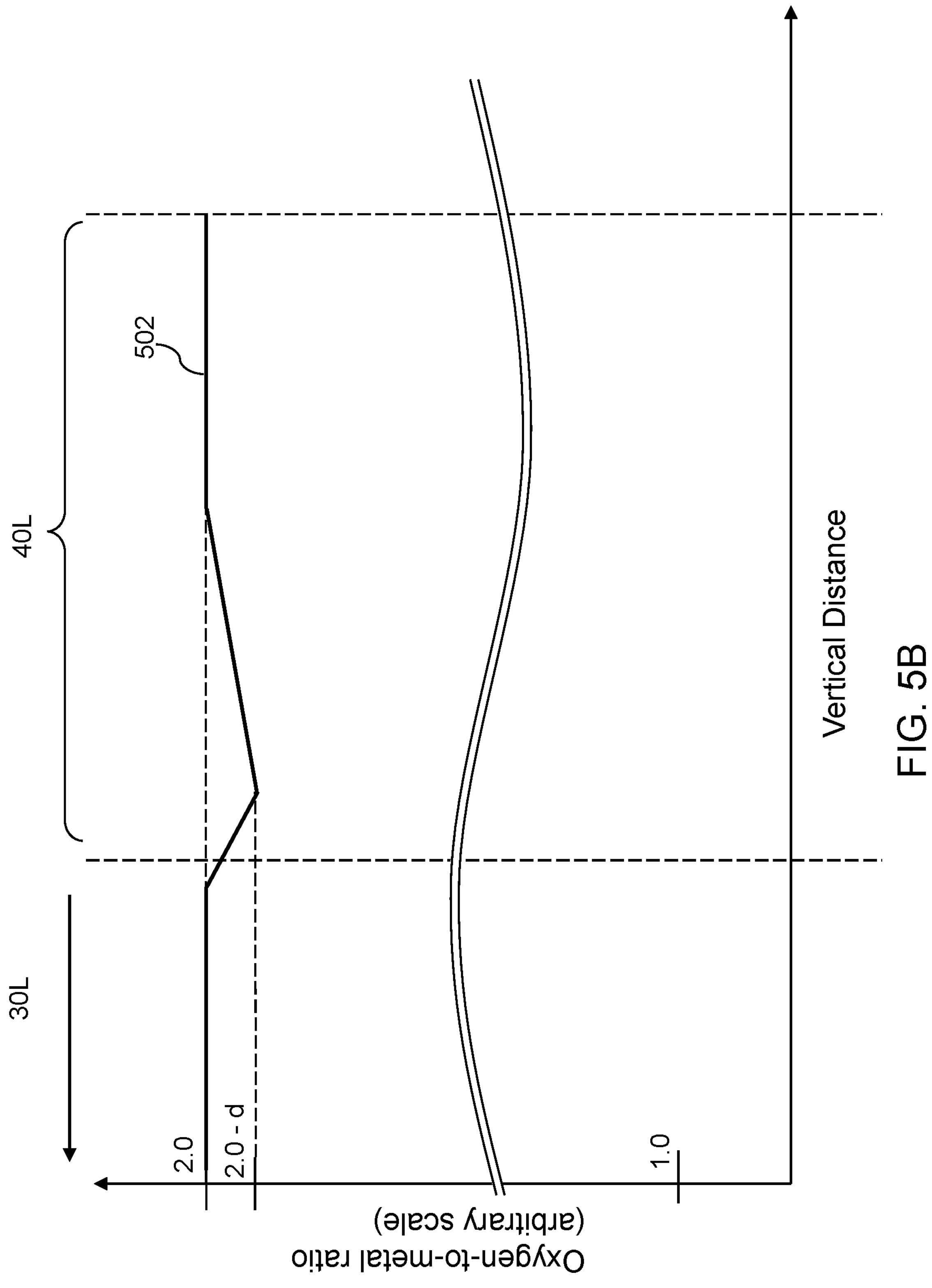
Figure 5C:
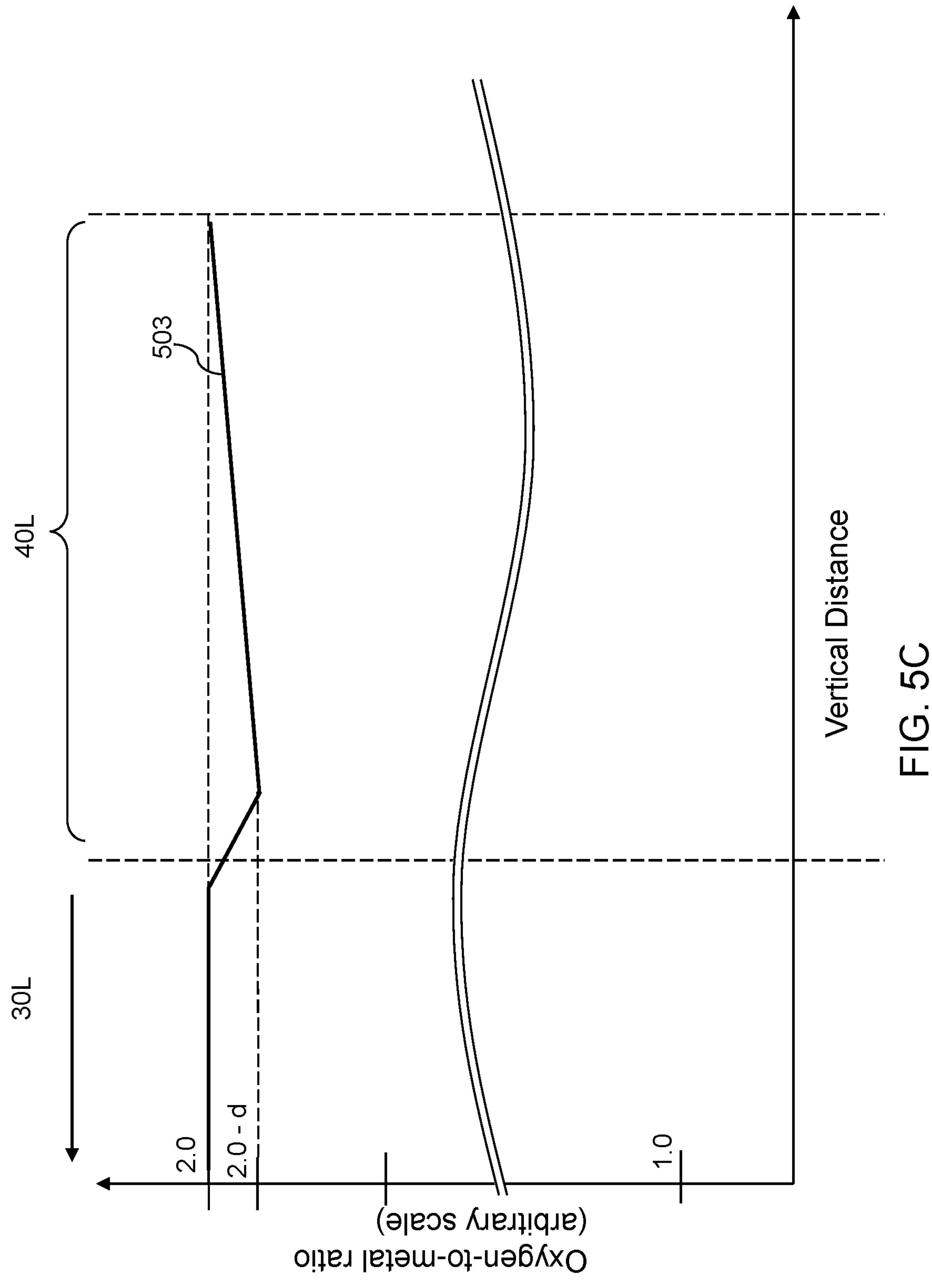

FIGS. 5A-5C are exemplary oxygen-to-metal ratio profiles in the continuous dielectric metal oxide layer 40L after performing the oxidation process according to various embodiments of the present disclosure.

Referring to FIG. 5A, curve 501 illustrates an oxygen-to-metal ratio profile for the embodiment in which the oxidation process completely oxidizes the continuous metal layer 140L into a stoichiometric doped or undoped titanium oxide material in which the oxygen-to-metal ratio is 2.0 throughout the entire volume of the continuous dielectric metal oxide layer 40L. Curve 501 illustrates an embodiment in which a stoichiometric oxygen-to-metal ratio in the continuous ferroelectric material layer 30L is 2.0. It is understood that the oxygen-to-metal ratio in the continuous ferroelectric material layer 30L may be different from 2.0 if the stoichiometric oxygen-to-metal ratio for the ferroelectric material in the continuous ferroelectric material layer 30L is not 2.0.

Referring to FIG. 5B, curve 502 illustrates an oxygen-to-metal ratio profile for the embodiment in which the oxidation process completely oxidizes a surface portion of the continuous metal layer 140L into a stoichiometric doped or undoped titanium oxide material in which the oxygen-to-metal ratio is 2.0, while an underlying portion of the continuous metal layer 140L is converted into a non-stoichiometric titanium oxide material due to insufficient supply of oxygen molecules during the oxidation process. This type of profile may occur when the continuous metal layer 140L is relatively thick. The minimum oxygen-to-metal ratio of 2.0-8 may be in a range from 1.60 to 1.999, such as from 1.70 to 1.95. Curve 502 illustrates an embodiment in which a stoichiometric oxygen-to-metal ratio in the continuous ferroelectric material layer 30L is 2.0. It is understood that the oxygen-to-metal ratio in the continuous ferroelectric material layer 30L may be different from 2.0 if the stoichiometric oxygen-to-metal ratio for the ferroelectric material in the continuous ferroelectric material layer 30L is not 2.0.

Referring to FIG. 5C, curve 503 illustrates an oxygen-to-metal ratio profile for the embodiment in which the oxidation process incompletely oxidizes the continuous metal layer 140L into a non-stoichiometric doped or undoped titanium oxide material in which the oxygen-to-metal ratio is less than 2.0. This type of profile may occur when the continuous metal layer 140L is relatively thick. The exposed surface of the continuous dielectric metal oxide layer 40L may, or may not, have the oxygen-to-metal ratio of 2.0. The minimum oxygen-to-metal ratio of 2.0-8 may be in a range from 1.60 to 1.999, such as from 1.70 to 1.95. Curve 503 illustrates an embodiment in which a stoichiometric oxygen-to-metal ratio in the continuous ferroelectric material layer 30L is 2.0. The oxygen-to-metal ratio in the continuous ferroelectric material layer 30L may be different from 2.0 in instances in which the stoichiometric oxygen-to-metal ratio for the ferroelectric material in the continuous ferroelectric material layer 30L is not 2.0.

Figure 6B:
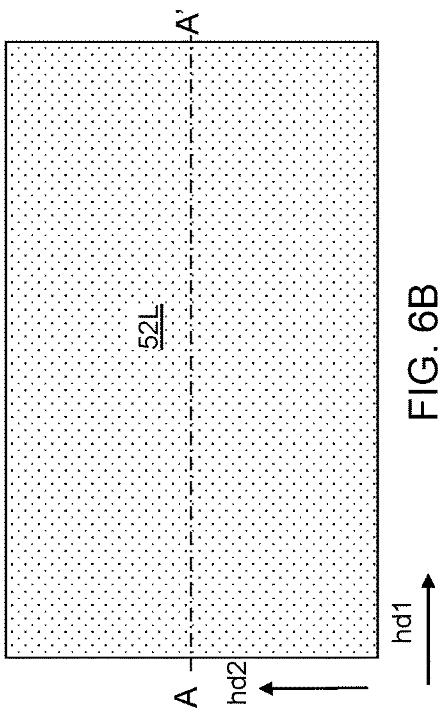
FIG. 6B is a top-down view of the region of the first exemplary structure of FIG. 6A. The vertical plane A-A' in FIG. 6B is the cut plane of the vertical cross-sectional view of FIG. 6A.
Figure 6A:
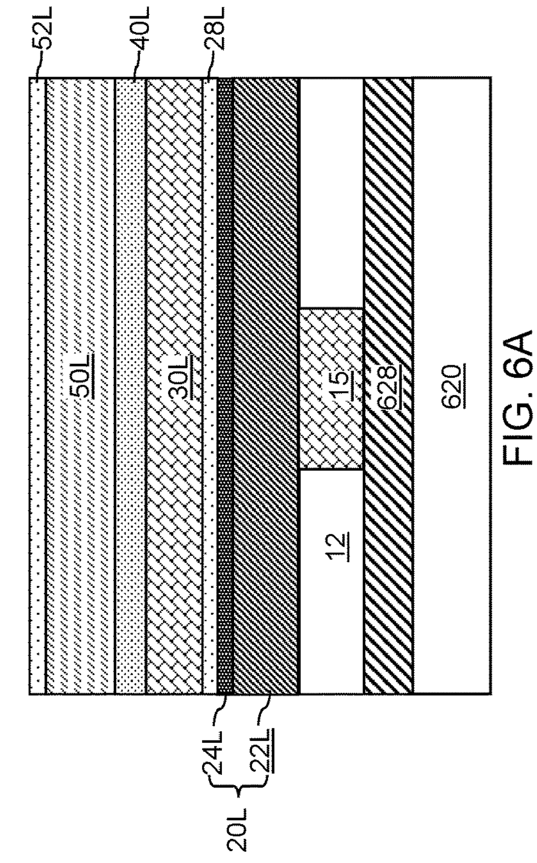
FIG. 6A is a vertical cross-sectional view of a region of the first exemplary structure after deposition of a continuous dielectric capping layer according to an embodiment of the present disclosure.

Referring to FIGS. 6A and 6B, a continuous semiconductor layer 50L may be deposited over the continuous dielectric metal oxide layer 40L. The continuous semiconductor layer 50L comprises, and/or consists essentially of, a compound semiconductor material. The compound semiconductor material of the continuous dielectric metal oxide layer 40L may have electrical conductivity in a range from $1.0\times10^{-5}$ S/cm to $1.0\times10^{1}$ S/cm. Exemplary compound semiconductor materials that may be used for the continuous semiconductor layer 50L include, but are not limited to, indium gallium zinc oxide (IGZO), indium oxide, indium tin oxide, indium zinc oxide, indium tungsten oxide, gallium oxide, gallium zinc oxide, doped zinc oxide, doped indium oxide (such as tungsten-doped indium oxide), doped cadmium oxide, gallium nitride, indium phosphide, gallium phosphide, gallium antimonide, indium antimonide, gallium arsenide, aluminum arsenide, indium arsenide, aluminum gallium arsenide, gallium indium arsenide, indium gallium arsenide, gallium indium phosphide, indium aluminum arsenide, silicon carbide, aluminum indium gallium phosphide, cadmium sulfide, cadmium selenide, cadmium telluride, zinc sulfide, zinc selenide, zinc telluride, lead sulfide, led telluride, mercury telluride, silicon, germanium, a silicon-germanium alloy, semiconducting carbon materials, and various other doped variants derived therefrom. Other suitable semiconducting materials are within the contemplated scope of disclosure. In one embodiment, the semiconducting material of the continuous semiconductor layer 50L may include indium gallium zinc oxide.

The continuous semiconductor layer 50L may include a polycrystalline semiconducting material, or an amorphous semiconducting material. The continuous semiconductor layer 50L may be deposited by physical vapor deposition, atomic layer deposition, chemical vapor deposition, pulsed laser deposition, etc. The thickness of the continuous semiconductor layer 50L may be in a range from 1 nm to 100 nm, such as from 2 nm to 50 nm and/or from 3 nm to 20 nm, although lesser and greater thicknesses may also be used.

A continuous dielectric capping layer 52L may be deposited over the continuous semiconductor layer 50L. The continuous dielectric capping layer 52L comprises a dielectric material that may block diffusion of hydrogen atoms. For example, the continuous dielectric capping layer 52L may comprise, and/or may consist essentially of, aluminum oxide, silicon nitride, titanium oxide, titanium carbide, silicon carbide nitride, or another hydrogen-blocking dielectric material. The thickness of the continuous dielectric capping layer 52L may be in a range from 1 nm to 10 nm, although lesser and greater thicknesses may also be used.

Figure 7B:
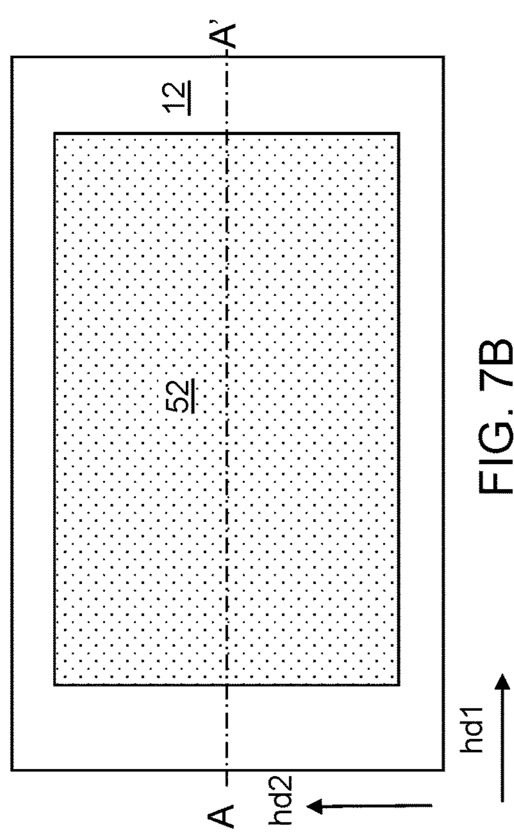
FIG. 7B is a top-down view of the region of the first exemplary structure of FIG. 7A. The vertical plane A-A' in FIG. 7B is the cut plane of the vertical cross-sectional view of FIG. 7A.
Figure 7A:
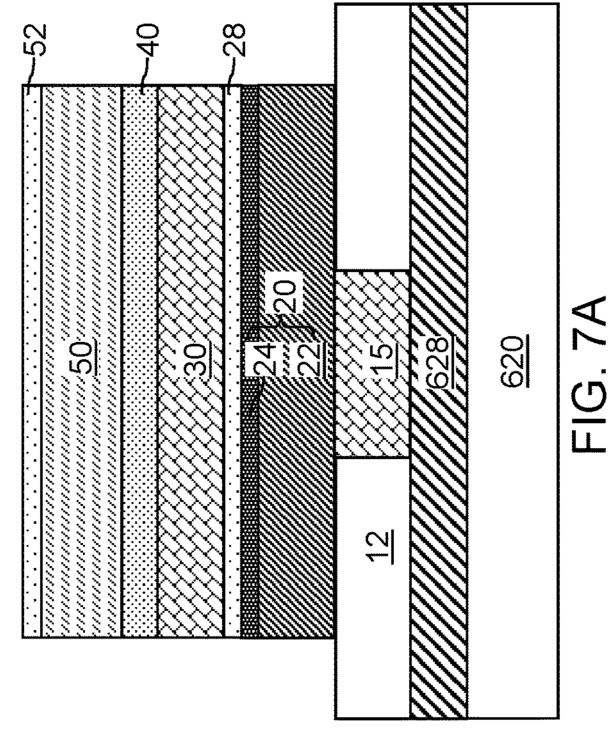
FIG. 7A is a vertical cross-sectional view of a region of the first exemplary structure after formation of a patterned layer stack including a bottom electrode, a ferroelectric material layer, a dielectric metal oxide layer, a semiconductor layer, and a dielectric capping layer according to an embodiment of the present disclosure.

Referring to FIGS. 7A and 7B, a photoresist layer (not shown) may be applied over the layer stack (20L, 28L, 30L, 40L, 50L, 52L) including the continuous bottom electrode material layer 20L, the optional continuous seed layer 28L, the continuous ferroelectric material layer 30L, the continuous dielectric metal oxide layer 40L, the continuous semiconductor layer 50L, and the continuous dielectric capping layer 52L, and may be lithographically patterned to cover an array of discrete areas each corresponding to an area of a respective ferroelectric device to be subsequently formed. Generally, each patterned area of the photoresist layer covers a portion of the layer stack (20L, 28L, 30L, 40L, 50L, 52L) that overlies, and covers, a respective connection via structure 15. An anisotropic etch process may be performed to transfer the pattern in the photoresist layer though the layer stack (20L, 28L, 30L, 40L, 50L, 52L). The anisotropic etch process may comprise a sequence of anisotropic etch steps having different etch chemistries to provide sequential etching of the various materials within the layer stack (20L, 28L, 30L, 40L, 50L, 52L). The connection-via-level dielectric layer 12 may be used as the etch stop layer for the terminal anisotropic etch step of the anisotropic etch process.

The continuous dielectric capping layer 52L is patterned into dielectric capping layers 52. The continuous semiconductor layer 50L is patterned into semiconductor layers 50. The continuous dielectric metal oxide layer 40L is patterned into dielectric metal oxide layers 40. The continuous ferroelectric material layer 30L is patterned into ferroelectric material layers 30. The continuous seed layers 28L, if present, is patterned into seed layers 28. The continuous bottom electrode material layer 20L is patterned into bottom electrodes 20. Each bottom electrode 20 is formed on a top surface of a respective connection via structure 15.

Generally, remaining portions of the layer stack (20L, 28L, 30L, 40L, 50L, 52L) comprise a plurality of patterned layer stacks (20, 28, 30, 40, 50, 52). Each patterned layer stack (20, 28, 30, 40, 50, 52) may comprise, from bottom to top, a bottom electrode 20, an optional seed layer 28, a ferroelectric material layer 30, a dielectric metal oxide layer 40, a semiconductor layer 50, and a dielectric capping layer 52. Generally, the ferroelectric material layer 30 is a dielectric layer. Within each patterned layer stack (20, 28, 30, 40, 50, 52), sidewalls of each layer may be vertically coincident with (i.e., located within a same vertical plane as) a respective sidewall of each overlying or underlying layer. The bottom electrode 20 may comprise a stack of a primary metal layer 22 and a metallic barrier capping layer 24. In one embodiment, the patterned layer stacks (20, 28, 30, 40, 50, 52) may be arranged as a two-dimensional periodic array that is repeated along the first horizontal direction hd1 with the first pitch, and is repeated along the second horizontal direction hd2 with the second pitch. Remaining portions of the photoresist layer may be subsequently removed, for example, by ashing.

Figure 8B:
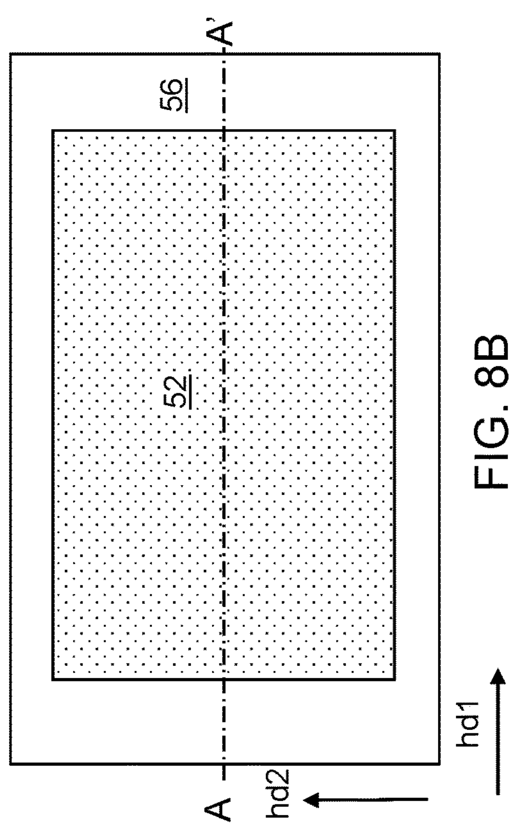
FIG. 8B is a top-down view of the region of the first exemplary structure of FIG. 8A. The vertical plane A-A' in FIG. 8B is the cut plane of the vertical cross-sectional view of FIG. 8A.
Figure 8A:
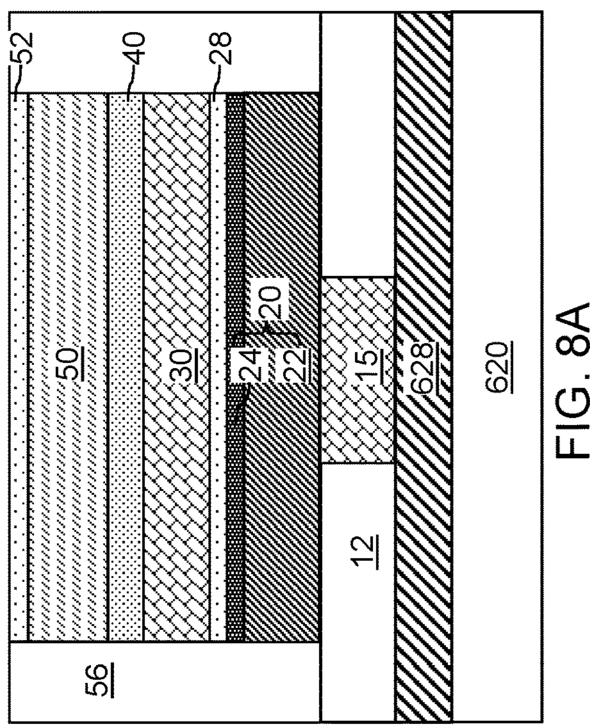
FIG. 8A is a vertical cross-sectional view of a region of the first exemplary structure after formation of a memory-level dielectric layer according to an embodiment of the present disclosure.

Referring to FIGS. 8A and 8B, a dielectric fill material such as silicon oxide may be deposited between neighboring pairs of patterned layer stacks (20, 28, 30, 40, 50, 52). Excess portions of the dielectric fill material may be removed from above the horizontal plane including the topmost surfaces of the patterned layer stacks (20, 28, 30, 40, 50, 52) by performing a planarization process, which may use a chemical mechanical polishing (CMP) process. A remaining dielectric matrix of the dielectric fill material is herein referred to as a memory-level dielectric layer 56. In one embodiment, top surfaces of the patterned layer stacks (20, 28, 30, 40, 50, 52) may be located within the horizontal plane including the top surface of the memory-level dielectric layer 56.

Figures 9A, 9B:
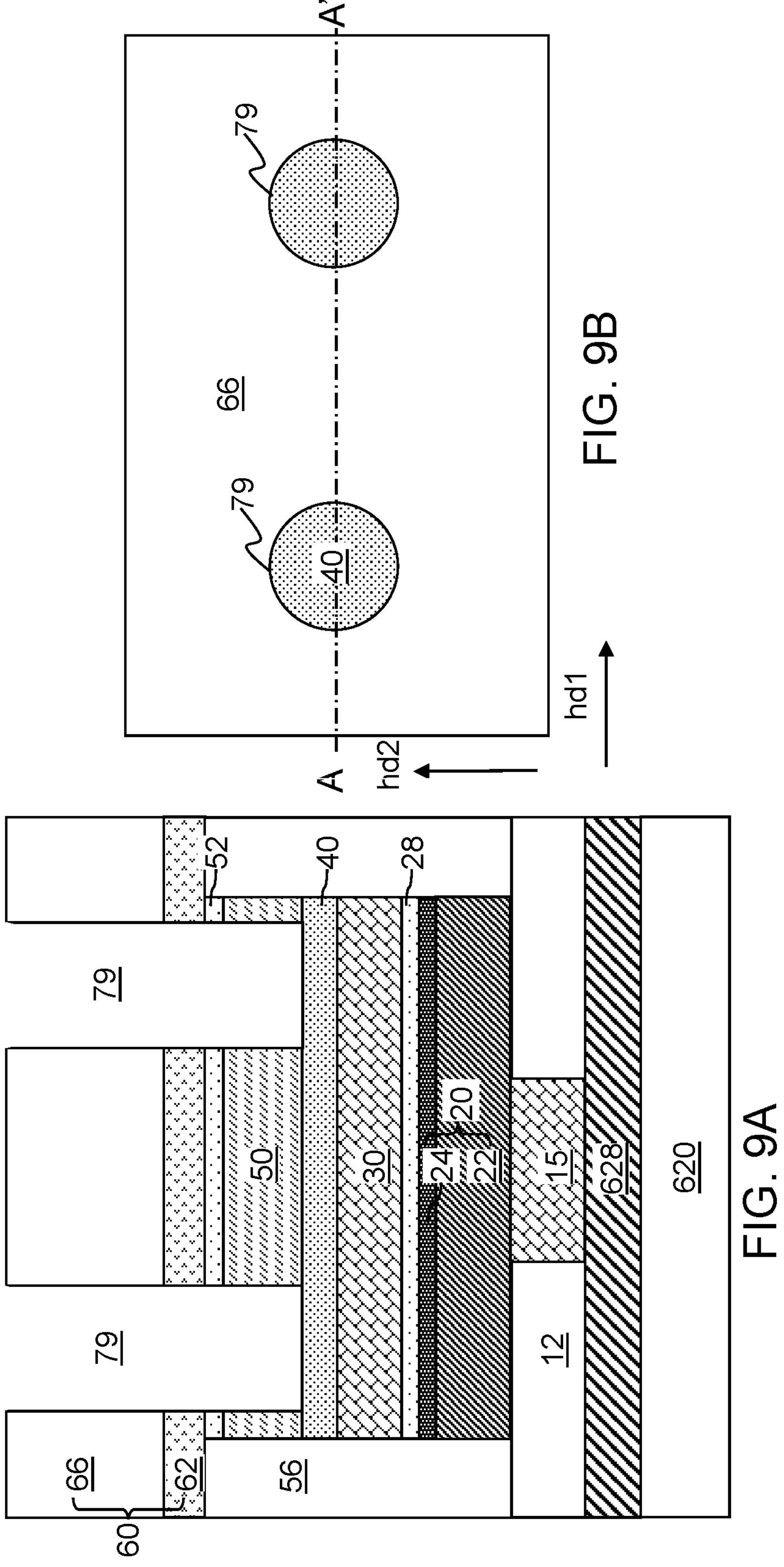
FIG. 9A is a vertical cross-sectional view of a region of the first exemplary structure after formation of a via-level dielectric layer and contact via cavities according to an embodiment of the present disclosure.
FIG. 9B is a top-down view of the region of the first exemplary structure of FIG. 9A. The vertical plane A-A' in FIG. 9B is the cut plane of the vertical cross-sectional view of FIG. 9A.

Referring to FIGS. 9A and 9B, a via-level dielectric layer 60 may be formed over the array of patterned layer stacks (20, 28, 30, 40, 50, 52) and the memory-level dielectric layer 56. In one embodiment, the via-level dielectric layer 60 may comprise a vertical stack including, from bottom to top, a via-level diffusion barrier dielectric layer 62 and a primary via-level dielectric layer 66. The via-level diffusion barrier dielectric layer 62 comprises a dielectric material that blocks hydrogen diffusion, which may adversely impact reliability of the ferroelectric devices including the patterned layer stacks (20, 28, 30, 40, 50, 52). For example, the via-level diffusion barrier dielectric layer 62 may comprise aluminum oxide, silicon nitride, titanium oxide, titanium carbide, silicon carbide nitride, or another hydrogen-blocking dielectric material. The thickness of the via-level diffusion barrier dielectric layer 62 may be in a range from 3 nm to 30 nm, although lesser and greater thicknesses may also be used. The primary via-level dielectric layer 66 comprises an interlayer dielectric (ILD) material such as undoped silicate glass, a doped silicate glass, porous or non-porous organosilicate glass, or another ILD material. The thickness of the primary via-level dielectric layer 66 may be in a range from 50 nm to 300 nm, although lesser and greater thicknesses may also be employed.

A photoresist layer (not shown) may be applied over the via-level dielectric layer 60, and may be lithographically patterned to form a pair of openings over each patterned layer stack (20, 28, 30, 40, 50, 52). Thus, a two-dimensional array of pairs of openings may be formed in the photoresist layer. An anisotropic etch process may be performed to transfer the pattern of the openings in the photoresist layer though the via-level dielectric layer 60, the dielectric capping layers 52, the semiconductor layers 50, and optionally into, and/or through, the dielectric metal oxide layers 40. In one embodiment, the dielectric metal oxide layers 40 may be used as etch stop structures. Alternatively, the ferroelectric material layers 30 may be used as etch stop structures. The embodiment illustrated in FIGS. 9A and 9B corresponds to an embodiment in which the dielectric metal oxide layers 40 are used as etch stop structures. A pair of contact via cavities 79 may be formed over each layer stack of a bottom electrode 20, an optional seed layer 28, and a ferroelectric material layer 30; and over, or through, a dielectric metal oxide layer 40; and through a semiconductor layer 50 and a dielectric capping layer 52. Within each area of a ferroelectric memory element, bottom surfaces of a pair of contact via cavities 79 may be formed on a top surface of the dielectric metal oxide layer 40, within the dielectric metal oxide layer 40, or on a top surface of the ferroelectric material layer 30. The photoresist layer may be subsequently removed, for example, by ashing.

Figures 10A, 10B:
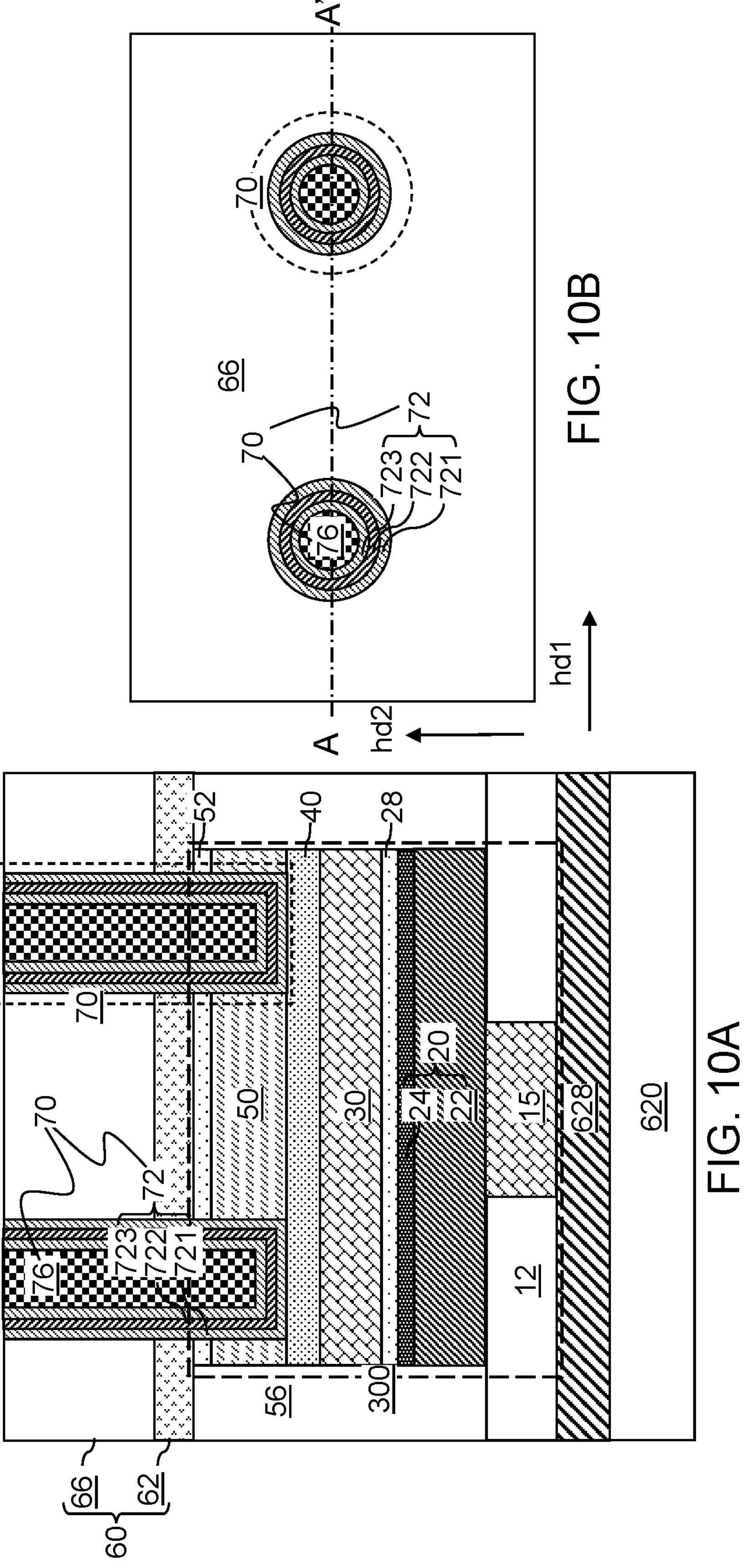
FIG. 10A is a vertical cross-sectional view of a region of the first exemplary structure after formation of metallic contact structures according to an embodiment of the present disclosure.
FIG. 10B is a top-down view of the region of the first exemplary structure of FIG. 10A. The vertical plane A-A' in FIG. 10B is the cut plane of the vertical cross-sectional view of FIG. 10A.

Referring to FIGS. 10A and 10B, at least one metallic material may be deposited in the contact via cavities 79. The at least one metallic material may comprise, in sequential order, a combination of a first metallic barrier material, a hydrogen-adsorbing metal, a second metallic barrier material, and a metallic fill material. In an illustrative example, the first metallic barrier material and the second metallic barrier material may comprise a metallic material that blocks diffusion of metallic elements. For example, the first metallic barrier material and the second metallic barrier material may comprise TiN, TaN, WN, MON, Ti, Ta, W, TiC, TaC, WC, or a combination thereof. The hydrogen-adsorbing metal comprises a metal that adsorbs hydrogen, such as titanium, zirconium, thorium, vanadium, palladium, copper, tungsten, or a combination thereof. The metallic fill material may comprise a metal that is resistant to hydrogen diffusion, and may function as a hydrogen diffusion barrier. For example, the metallic fill material may comprise ruthenium, aluminum, platinum, silver, cobalt, iron, tin, and/or nickel.

Excess portions of the at least one metallic material may be removed from above the horizontal plane including the top surface of the via-level dielectric layer 60 by a planarization process, which may use a chemical mechanical polishing (CMP) process and/or a recess etch process. Each remaining portion of the at least one metallic material filling a respective contact via cavity 79 constitutes a metallic contact structure 70. Each metallic contact structure 70 may comprise a first metallic barrier liner 721 comprising the first metallic barrier material, a hydrogen-adsorbing metal liner 722 comprising the hydrogen-adsorbing metal, a second metallic barrier liner 723 comprising the second metallic barrier material, and a metallic fill material portion 76 comprising the metallic fill material. Each contiguous combination of a first metallic barrier liner 721, a hydrogen-adsorbing metal liner 722, and a second metallic barrier liner 723 constitutes a metallic liner stack 72.

Generally, a pair of metallic contact structures 70 may be formed in each area of a ferroelectric device 300. The metallic contact structures 70 may have top surfaces located within a horizontal plane including the top surface of the via-level dielectric layer 60. In one embodiment, an array of pairs of metallic contact structures 70 may be arranged as a two-dimensional periodic array that is repeated along the first horizontal direction hd1 with a first pitch, and is repeated along the second horizontal direction hd2 with a second pitch.

In one embodiment, each pair of metallic contact structures 70 may be formed through a respective semiconductor layer 50 such that the pair of metallic contact structures 70 are laterally spaced from each other by a portion of the semiconductor layer 50. The portion of the semiconductor layer 50 located between the pair of metallic contact structures 70 functions as a channel of a thin film transistor including the semiconductor layer 50 and the pair of metallic contact structures 70. The pair of metallic contact structures 70 function as a source structure and a drain structure of the thin film transistor. The underlying ferroelectric material layer 30 functions a primary gate dielectric layer. The underlying bottom electrode 20 functions as the gate electrode of the thin film transistor. In one embodiment, each pair of metallic contact structures 70 may be formed on a respective dielectric metal oxide layer 40 such that the pair of metallic contact structures 70 are laterally spaced apart by a portion of the dielectric metal oxide layer 40.

The polarization direction of the ferroelectric material layer 30 may be programed by applying a programming electrical field between the bottom electrode 20 and the semiconductor layer 50 which is electrically biased by the pair of metallic contact structures 70. The programming electrical field may point upward or downward depending on the desired direction of electrical polarization to be programmed within the ferroelectric material layer 30. The data stored in the ferroelectric material layer 30 in the form of the polarization direction may be read by applying a small bias voltage between the pair of metallic contact structures 70 and by turning on the thin film transistor by applying a gate bias voltage to the bottom electrode 20. The magnitude of the electrical current that flows through the semiconductor layer 50 between the pair of metallic contact structures 70 may be measured using a sense amplifier (which may comprise one of the field effect transistors 701 illustrated in FIG. 1).

Generally, the semiconductor layer 50 may comprise a polycrystalline compound semiconductor material or an amorphous compound semiconductor material, and may be p-doped or n-doped. In one embodiment, the semiconductor layer 50 may be deposited as an amorphous compound semiconductor material layer, and may be converted into a polycrystalline semiconductor layer by performing a thermal anneal process after formation of the metallic contact structures 70. In this embodiment, the material of the first metallic barrier liner 721 may be selected from materials that may be used as a crystallization template material for the purpose of inducing crystallization of large grains in the amorphous compound semiconductor material of the semiconductor layer 50. For example, the first metallic barrier liner 721 of each metallic contact structure 70 may comprise TIN, TaN, WN, or MoN.

The lateral separation distance between the pair of metallic contact structures 70 overlying a ferroelectric device 300 defines the channel length of the thin film transistor within the ferroelectric device 300. The lateral separation distance depends on the operating voltage of the ferroelectric device 300 and the thickness of the ferroelectric material layer 30, and may be generally in a range from 10 nm to 300 nm, although lesser and greater lateral separation distances may also be used.

Figures 11A, 11B:
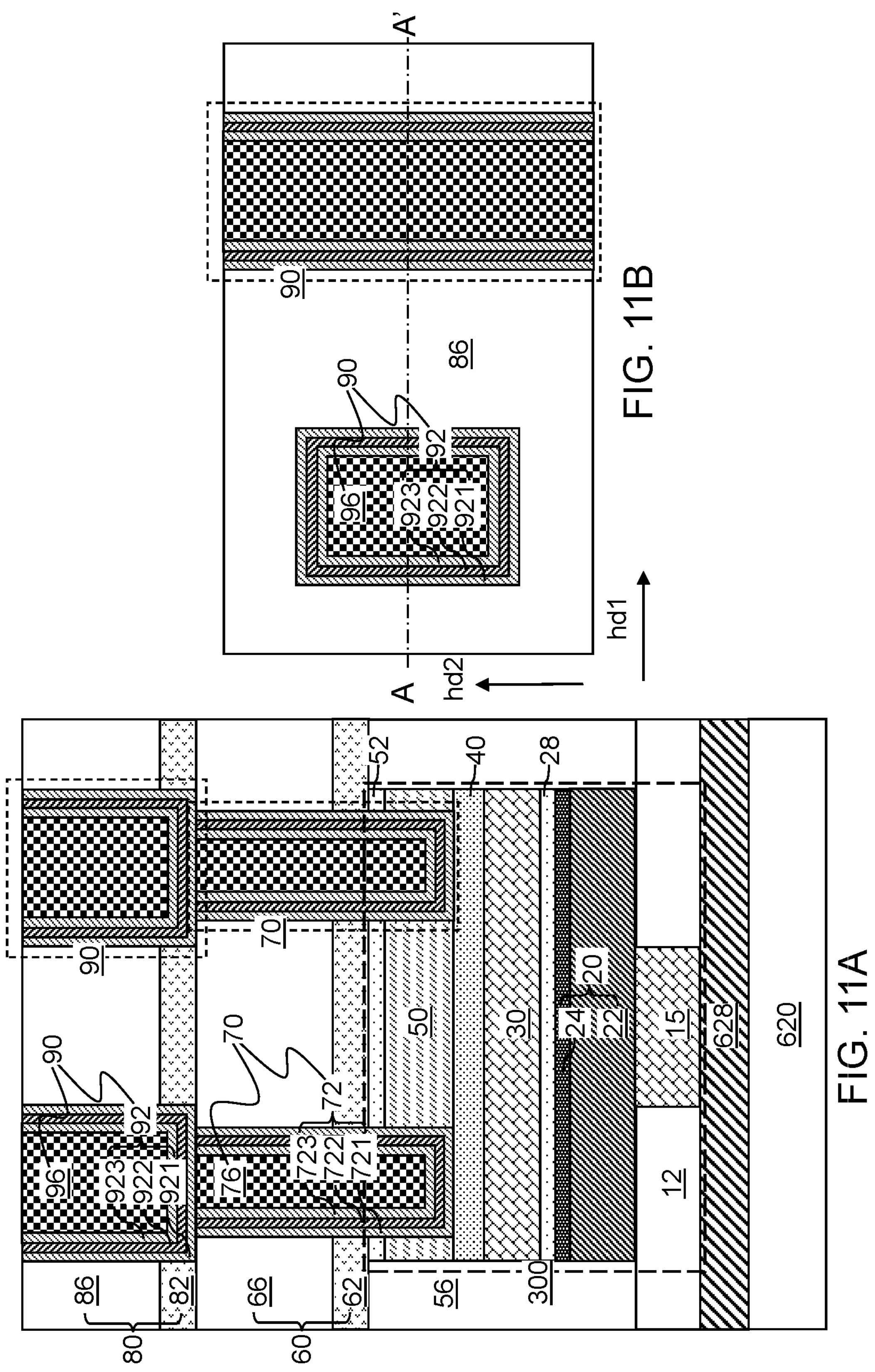
FIG. 11A is a vertical cross-sectional view of a region of the first exemplary structure after formation of a line-level dielectric layer and metal lines according to an embodiment of the present disclosure.
FIG. 11B is a top-down view of the region of the first exemplary structure of FIG. 11A. The vertical plane A-A' in FIG. 11B is the cut plane of the vertical cross-sectional view of FIG. 11A.

Referring to FIGS. 11A and 11B, a line-level dielectric layer 80 may be formed over the array of metallic contact structures 70 and the via-level dielectric layer 60. In one embodiment, the line-level dielectric layer 80 may comprise a vertical stack including, from bottom to top, a line-level diffusion barrier dielectric layer 82 and a primary line-level dielectric layer 86. The line-level diffusion barrier dielectric layer 82 comprises a dielectric material that blocks hydrogen diffusion, which may adversely impact reliability of the ferroelectric devices 300. For example, the line-level diffusion barrier dielectric layer 82 may comprise aluminum oxide, silicon nitride, titanium oxide, titanium carbide, silicon carbide nitride, or another hydrogen-blocking dielectric material. The thickness of the line-level diffusion barrier dielectric layer 82 may be in a range from 3 nm to 30 nm, although lesser and greater thicknesses may also be used. The primary line-level dielectric layer 86 comprises an interlayer dielectric (ILD) material such as undoped silicate glass, a doped silicate glass, porous or non-porous organosilicate glass, or another ILD material. The thickness of the primary line-level dielectric layer 86 may be in a range from 50 nm to 300 nm, although lesser and greater thicknesses may also be used.

A photoresist layer (not shown) may be applied over the line-level dielectric layer 80, and may be lithographically patterned to form line-shaped openings. In one embodiment, for each pair of metallic contact structures 70 formed on a ferroelectric device 300, a first line-shaped opening may be formed over one of the metallic contact structures 70, and a second line-shaped opening may be formed over another of the metallic contact structures 70. Each first line-shaped opening may have a lateral extent that is less than the second periodicity of the two-dimensional array of ferroelectric devices 300 along the second horizontal direction hd2. Each second line-shaped opening may laterally extend over a column of metallic contact structures 70 that are arranged along the second horizontal direction hd2. An anisotropic etch process may be performed to transfer the pattern of the openings in the photoresist layer though the line-level dielectric layer 80. At least one metallic contact structure 70 may be physically exposed within each line cavity formed within the line-level dielectric layer 80. The photoresist layer may be subsequently removed, for example, by ashing.

At least one metallic material may be deposited in the line cavities. The at least one metallic material may comprise, in sequential order, a combination of a first metallic barrier material, a hydrogen-adsorbing metal, a second metallic barrier material, and a metallic fill material. In an illustrative example, the first metallic barrier material and the second metallic barrier material may comprise a metallic material that blocks diffusion of metallic elements. For example, the first metallic barrier material and the second metallic barrier material may comprise TiN, TaN, WN, MON, Ti, Ta, W, TiC, TaC, WC, or a combination thereof. The hydrogen-adsorbing metal comprises a metal that adsorbs hydrogen, such as titanium, zirconium, thorium, vanadium, palladium, copper, tungsten, or a combination thereof. The metallic fill material may comprise a metal that is resistant to hydrogen diffusion, and may function as a hydrogen diffusion barrier. For example, the metallic fill material may comprise ruthenium, aluminum, platinum, silver, cobalt, iron, tin, and/or nickel.

Excess portions of the at least one metallic material may be removed from above the horizontal plane including the top surface of the line-level dielectric layer 80 by a planarization process, which may use a chemical mechanical polishing (CMP) process and/or a recess etch process. Each remaining portion of the at least one metallic material filling a respective line cavity constitutes a metal line 90. Each metal line 90 may comprise a first metallic barrier liner 921 comprising the first metallic barrier material, a hydrogen-adsorbing metal liner 922 comprising the hydrogen-adsorbing metal, a second metallic barrier liner 923 comprising the second metallic barrier material, and a metallic fill material portion 96 comprising the metallic fill material. Each contiguous combination of a first metallic barrier liner 921, a hydrogen-adsorbing metal liner 922, and a second metallic barrier liner 923 constitutes a metallic liner stack 92.

Figures 12A, 12B:
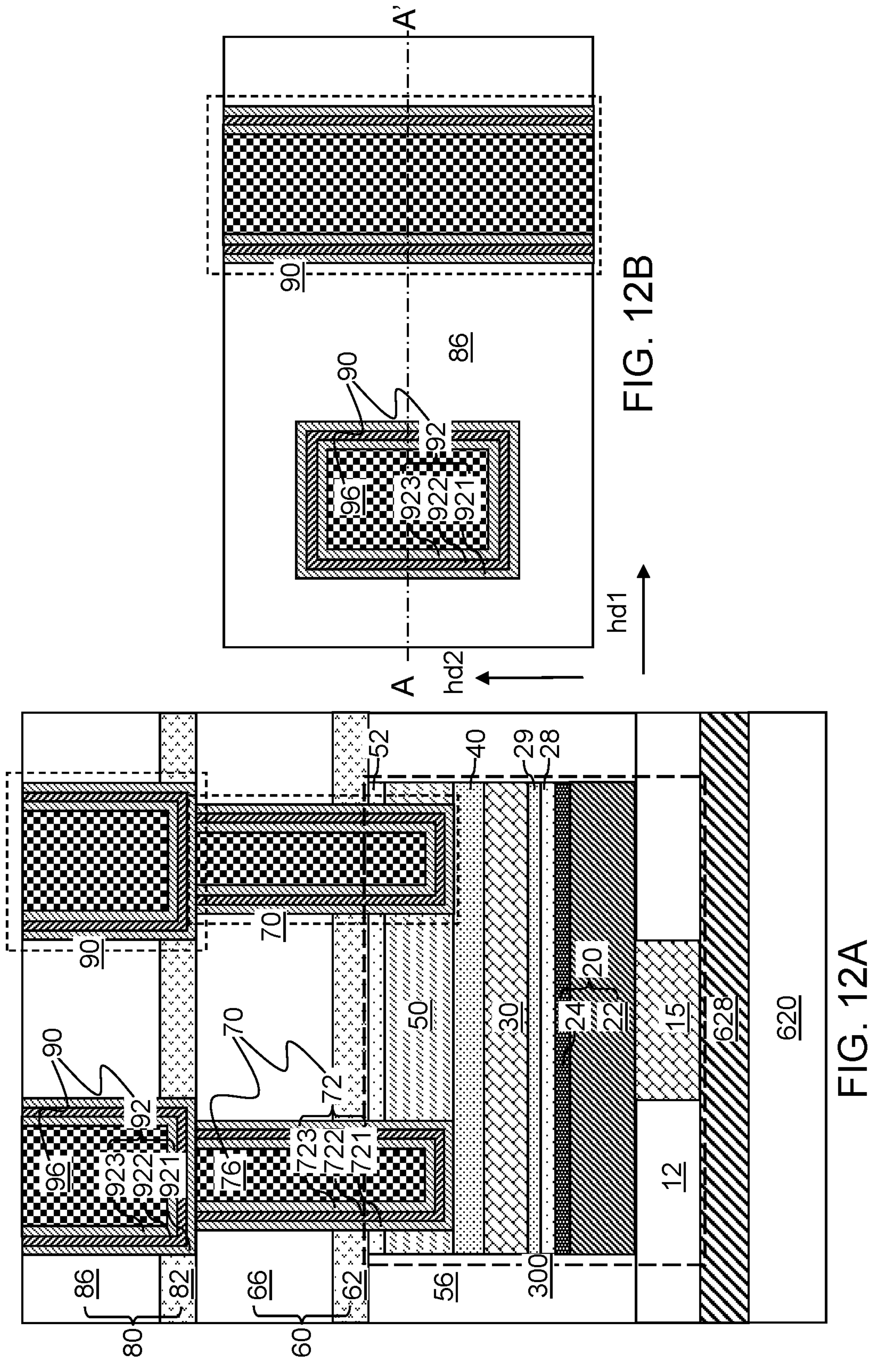
FIG. 12A is a vertical cross-sectional view of a region of a first alternative configuration of the first exemplary structure after formation of a line-level dielectric layer and metal lines according to an embodiment of the present disclosure.
FIG. 12B is a top-down view of the region of the first exemplary structure of FIG. 12A. The vertical plane A-A' in FIG. 12B is the cut plane of the vertical cross-sectional view of FIG. 12A.

Referring to FIGS. 12A and 12B, a first alternative configuration of the first exemplary structure may be derived from the first exemplary structure illustrated in FIGS. 11A and 11B (or any other alternative configuration thereof described below) by providing a backside interfacial dielectric layer 29 between the seed layer 28 and the ferroelectric material layer 30. In this embodiment, a continuous backside interfacial dielectric layer may be formed on a top surface of the continuous seed layer 28L, and the continuous ferroelectric material layer 30L may be deposited over the continuous backside interfacial dielectric layer during the processing steps described with reference to FIGS. 3A and 3B. The continuous backside interfacial dielectric layer may be patterned into backside interfacial dielectric layers 29 at a processing step described with reference to FIGS. 7A and 7B. The continuous backside interfacial dielectric layer may include a dielectric material that may facilitate growth of the continuous ferroelectric material layer 30L. For example, the continuous backside interfacial dielectric layer may comprise a dielectric metal oxide having a same or similar crystal structure and/or a same or similar lattice constant as the material of the continuous ferroelectric material layer 30L. In an illustrative example, in embodiments in which the continuous ferroelectric material layer 30L comprises hafnium oxide, the continuous backside interfacial dielectric layer (and thus, each backside interfacial dielectric layer 29) may comprise zirconium oxide, titanium oxide, or aluminum oxide having a thickness in a range from 0.1 nm to 1 nm, such as from 0.2 nm to 0.5 nm, although lesser and greater thicknesses may also be used. In another example, the backside interfacial dielectric layer (and thus, each backside interfacial dielectric layer 29) may comprise indium oxide having a thickness in a range from 0.1 nm to 1 nm, such as from 0.2 nm to 0.5 nm, although lesser and greater thicknesses may also be used.

Figures 13A, 13B:
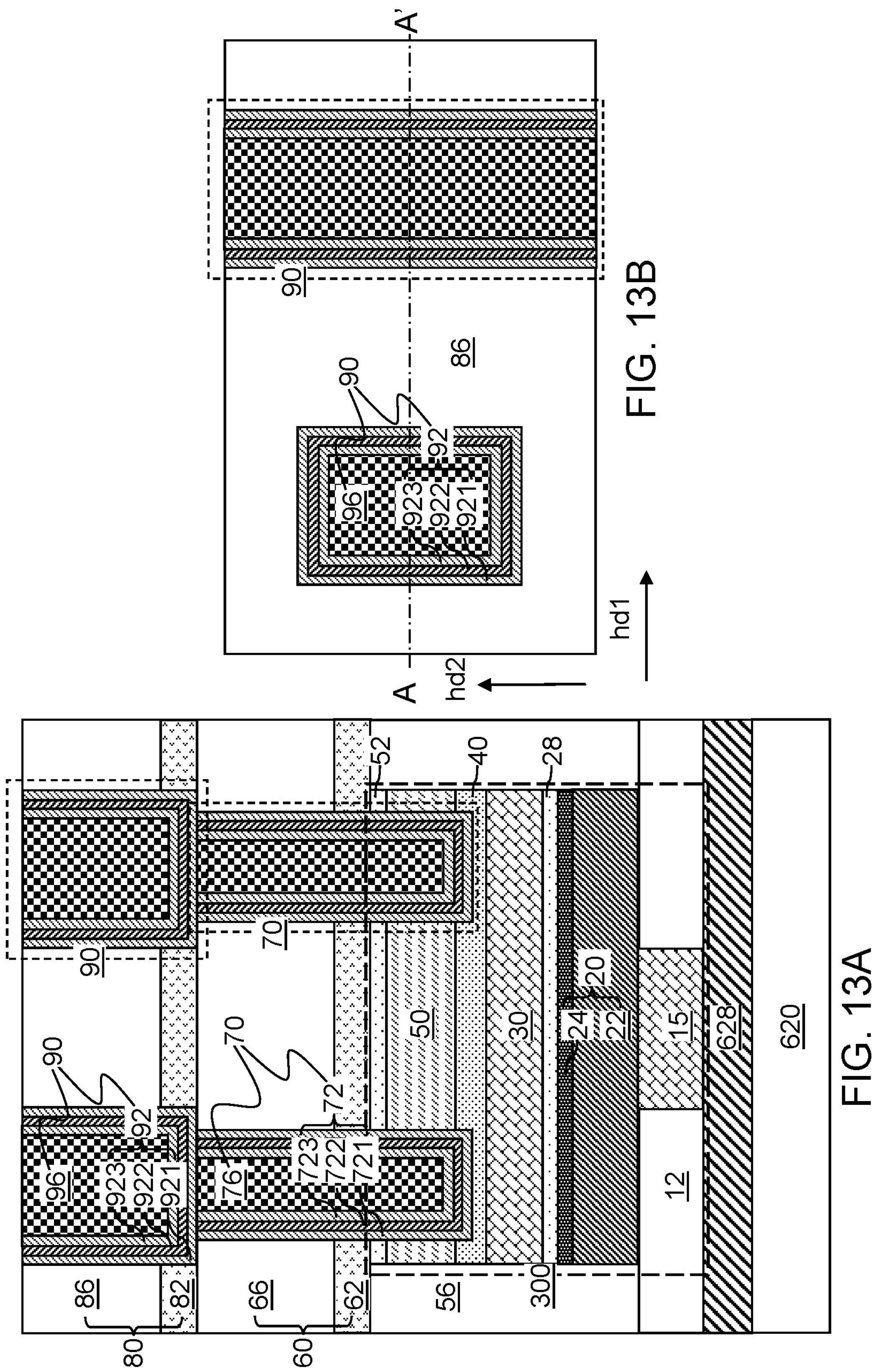
FIG. 13A is a vertical cross-sectional view of a region of a second alternative configuration of the first exemplary structure after formation of a line-level dielectric layer and metal lines according to an embodiment of the present disclosure.
FIG. 13B is a top-down view of the region of the first exemplary structure of FIG. 13A. The vertical plane A-A' in FIG. 13B is the cut plane of the vertical cross-sectional view of FIG. 13A.

Referring to FIGS. 13A and 13B, a second alternative configuration of the first exemplary structure may be derived from the first exemplary structure illustrated in FIGS. 11A and 11B (or any other alternative configuration thereof described above or below) by forming contact via cavities 79 such that bottom surfaces of the contact via cavities 79 are formed below the horizontal plane including the top surface of the dielectric metal oxide layer 40 and above the horizontal plane including the bottom surface of the dielectric metal oxide layer 40. In this embodiment, the metallic contact structures 70 may have bottom surfaces contacting a respective recessed horizontal surface of the dielectric metal oxide layer 40.

Figures 14A, 14B:
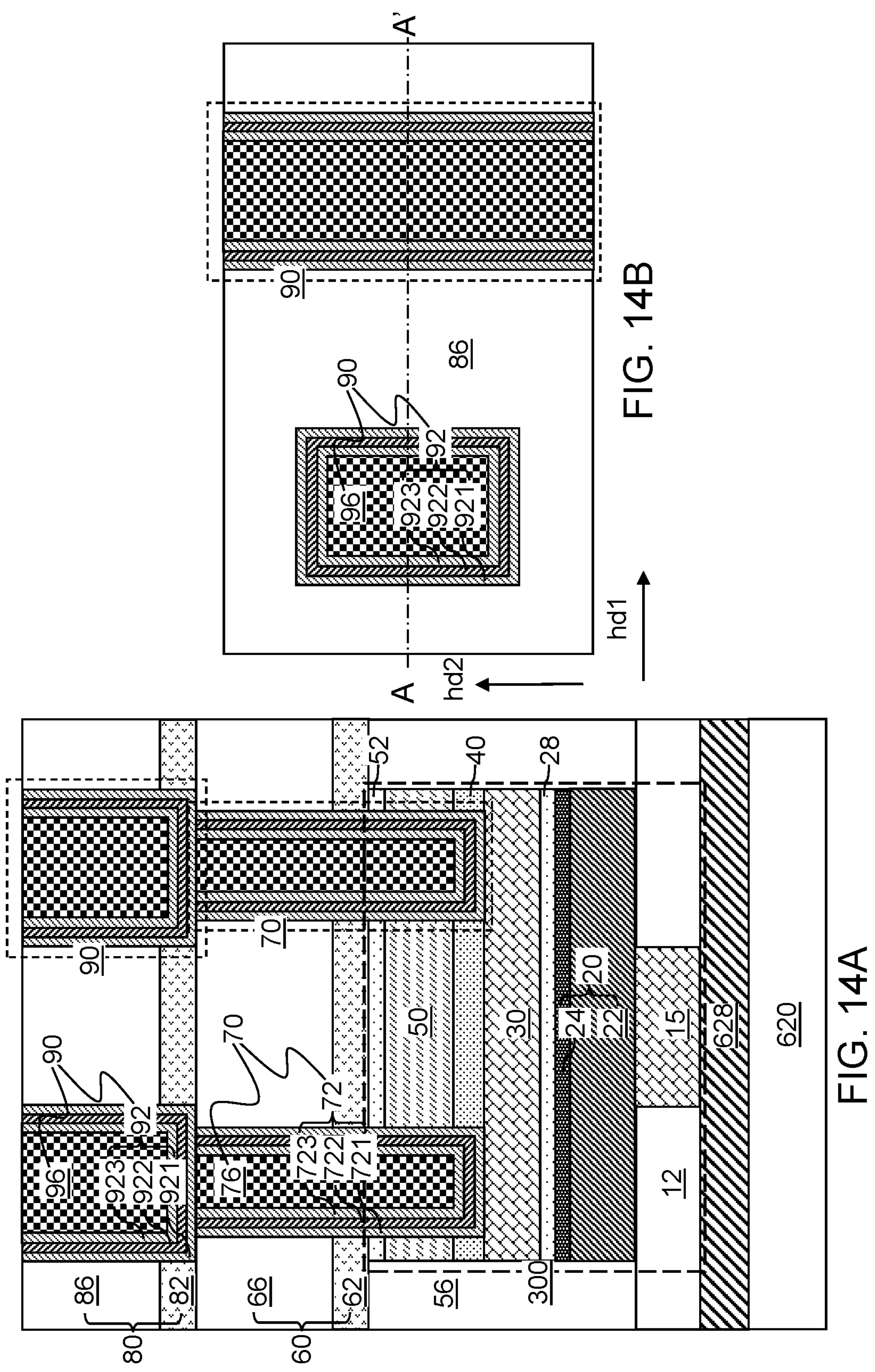
FIG. 14A is a vertical cross-sectional view of a region of a third alternative configuration of the first exemplary structure after formation of a line-level dielectric layer and metal lines according to an embodiment of the present disclosure.
FIG. 14B is a top-down view of the region of the first exemplary structure of FIG. 14A. The vertical plane A-A' in FIG. 14B is the cut plane of the vertical cross-sectional view of FIG. 14A.

Referring to FIGS. 14A and 14B, a third alternative configuration of the first exemplary structure may be derived from the first exemplary structure illustrated in FIGS. 11A and 11B (or any other alternative configuration thereof described above or below) by forming contact via cavities 79 such that bottom surfaces of the contact via cavities 79 are formed at, or below, the horizontal plane including the top surface of the ferroelectric material layer 30. In this embodiment, the metallic contact structures 70 may have bottom surfaces contacting a respective horizontal surface segment of the ferroelectric material layer 30.

Figures 15A, 15B:
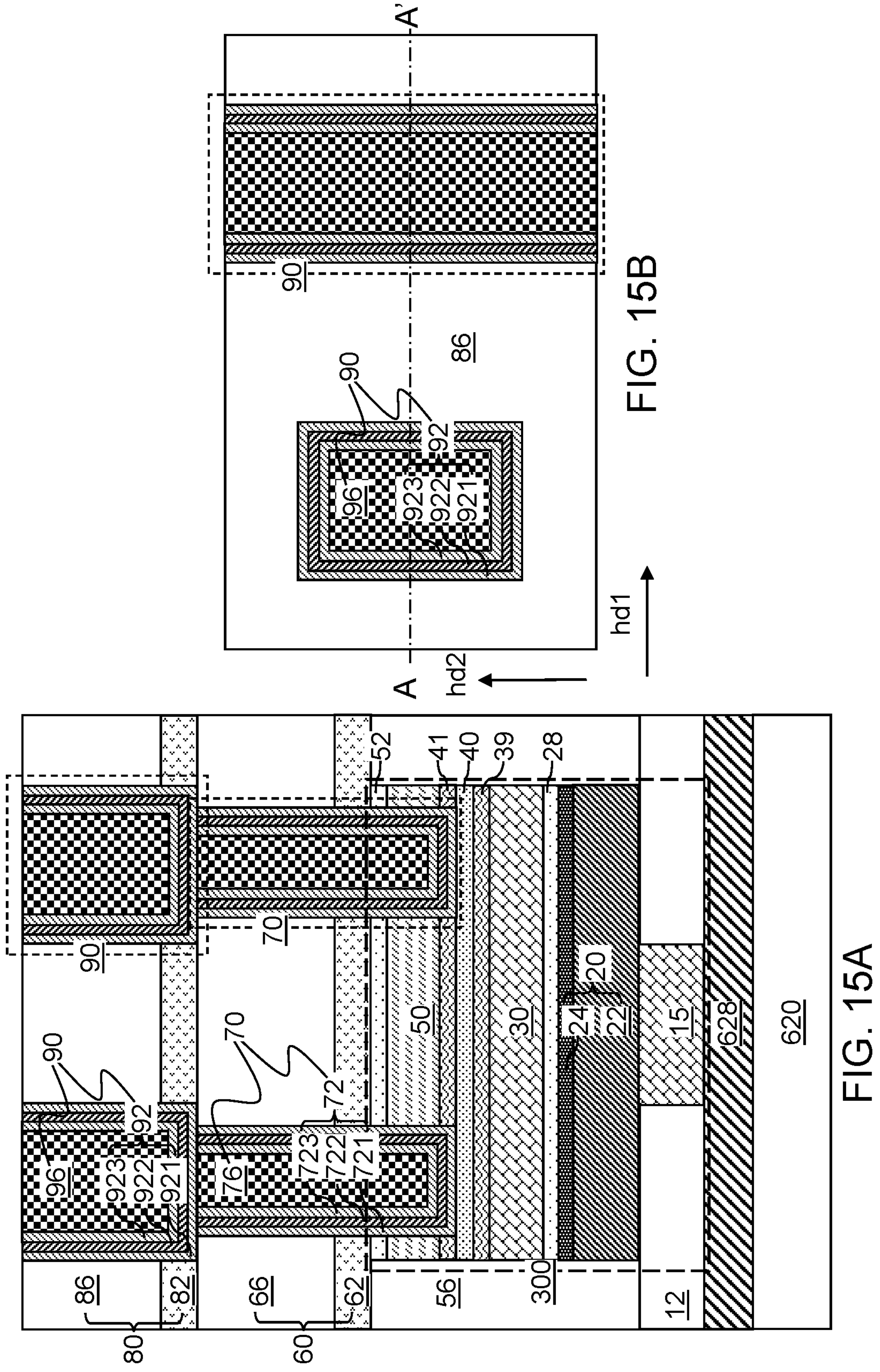
FIG. 15A is a vertical cross-sectional view of a region of a fourth alternative configuration of the first exemplary structure after formation of a line-level dielectric layer and metal lines according to an embodiment of the present disclosure.
FIG. 15B is a top-down view of the region of the first exemplary structure of FIG. 15A. The vertical plane A-A' in FIG. 15B is the cut plane of the vertical cross-sectional view of FIG. 15A.

Referring to FIGS. 15A and 15B, a fourth alternative configuration of the first exemplary structure may be derived from the first exemplary structure illustrated in FIGS. 11A and 11B (or any other alternative configuration thereof described above or below) by depositing at least one continuous interfacial dielectric metal oxide layer (39, 41) over the continuous ferroelectric material layer 30L prior to, or after, formation of the continuous dielectric metal oxide layer 40L. For example, the at least one continuous interfacial dielectric metal oxide layer (39, 41) may comprise a ferroelectric-side interfacial dielectric metal oxide layer 39 that is formed between the ferroelectric material layer 30 and the dielectric metal oxide layer 40, and a channel-side interfacial dielectric metal oxide layer 41 that is formed between the dielectric metal oxide layer 40 and the semiconductor layer 50.

The ferroelectric-side interfacial dielectric metal oxide layer 39 comprises a dielectric metal oxide material that reduces formation of crystalline defects in the continuous metal layer 140L and in the dielectric metal oxide layer 40. For example, the ferroelectric-side interfacial dielectric metal oxide layer 39 may comprise zirconium oxide, titanium oxide, or aluminum oxide. The ferroelectric-side interfacial dielectric metal oxide layer 39 may be formed by plasma-enhanced atomic layer deposition process, or by deposition of a metal and subsequent oxidation (for example, by a thermal anneal, a plasm oxidation, or a deionized ozonated water treatment), and may have a thickness in a range from 0.1 nm to 1 nm, such as from 0.2 nm to 0.5 nm, although lesser and greater thicknesses may also be used.

The channel-side interfacial dielectric metal oxide layer 41 comprises a dielectric metal oxide material that reduces formation of crystalline defects in the continuous semiconductor layer 50L, and thus, in the semiconductor layer 50. For example, the channel-side interfacial dielectric metal oxide layer 41 may comprise zirconium oxide, titanium oxide, or aluminum oxide. The channel-side interfacial dielectric metal oxide layer 41 may be formed by plasma-enhanced atomic layer deposition process, or by deposition of a metal and subsequent oxidation (for example, by a thermal anneal, a plasm oxidation, or a deionized ozonated water treatment), and may have a thickness in a range from 0.1 nm to 1 nm, such as from 0.2 nm to 0.5 nm, although lesser and greater thicknesses may also be used.

Figures 16A, 16B:
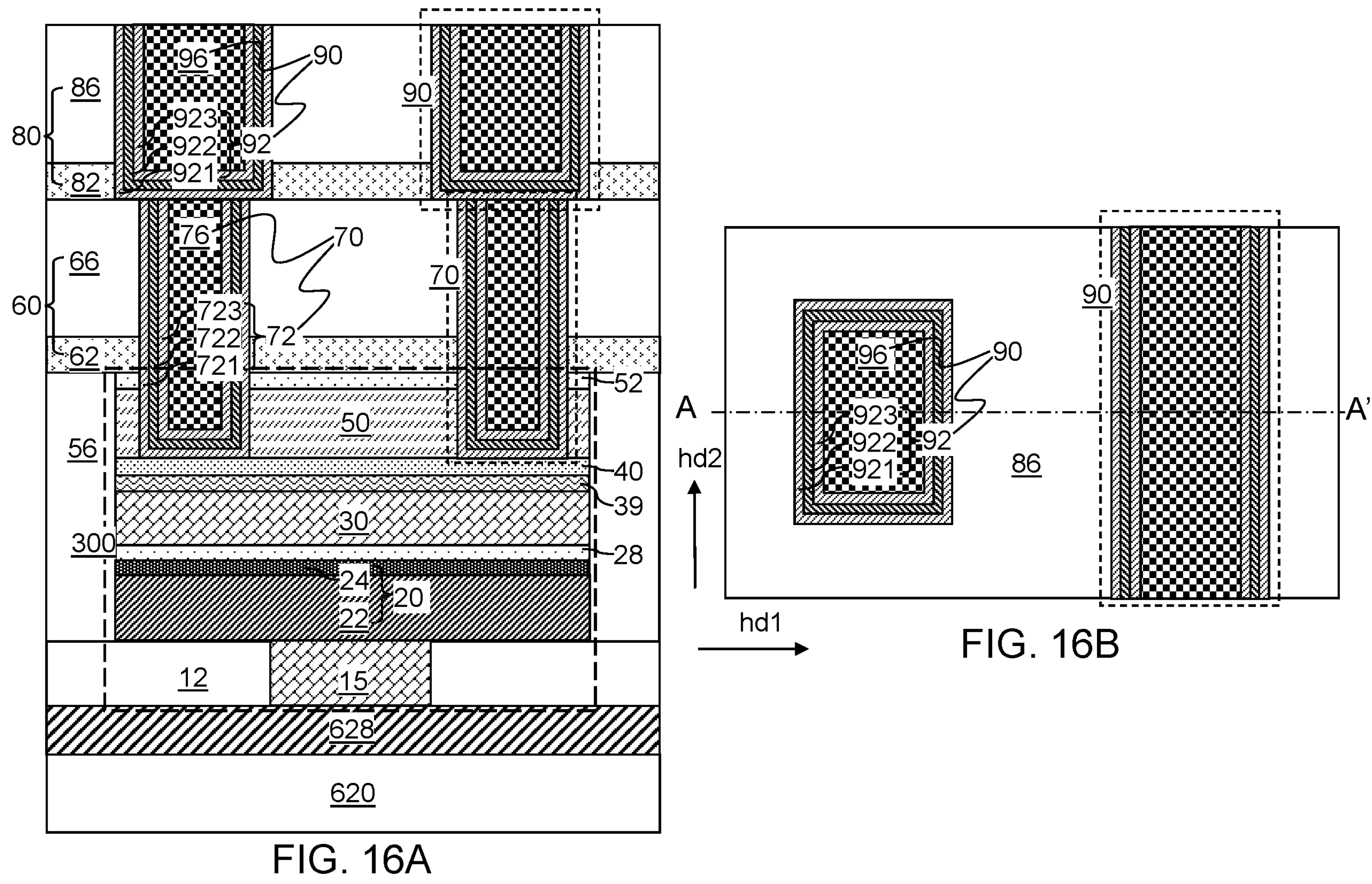
FIG. 16A is a vertical cross-sectional view of a region of a fifth alternative configuration of the first exemplary structure after formation of a line-level dielectric layer and metal lines according to an embodiment of the present disclosure.
FIG. 16B is a top-down view of the region of the first exemplary structure of FIG. 16A. The vertical plane A-A' in FIG. 16B is the cut plane of the vertical cross-sectional view of FIG. 17A.

Referring to FIGS. 16A and 16B, a fifth alternative configuration of the first exemplary structure may be derived from fourth alternative configuration of the first exemplary structure illustrated in FIGS. 15A and 15B by omitting formation of the channel-side interfacial dielectric metal oxide layer 41.

Figures 17A, 17B:
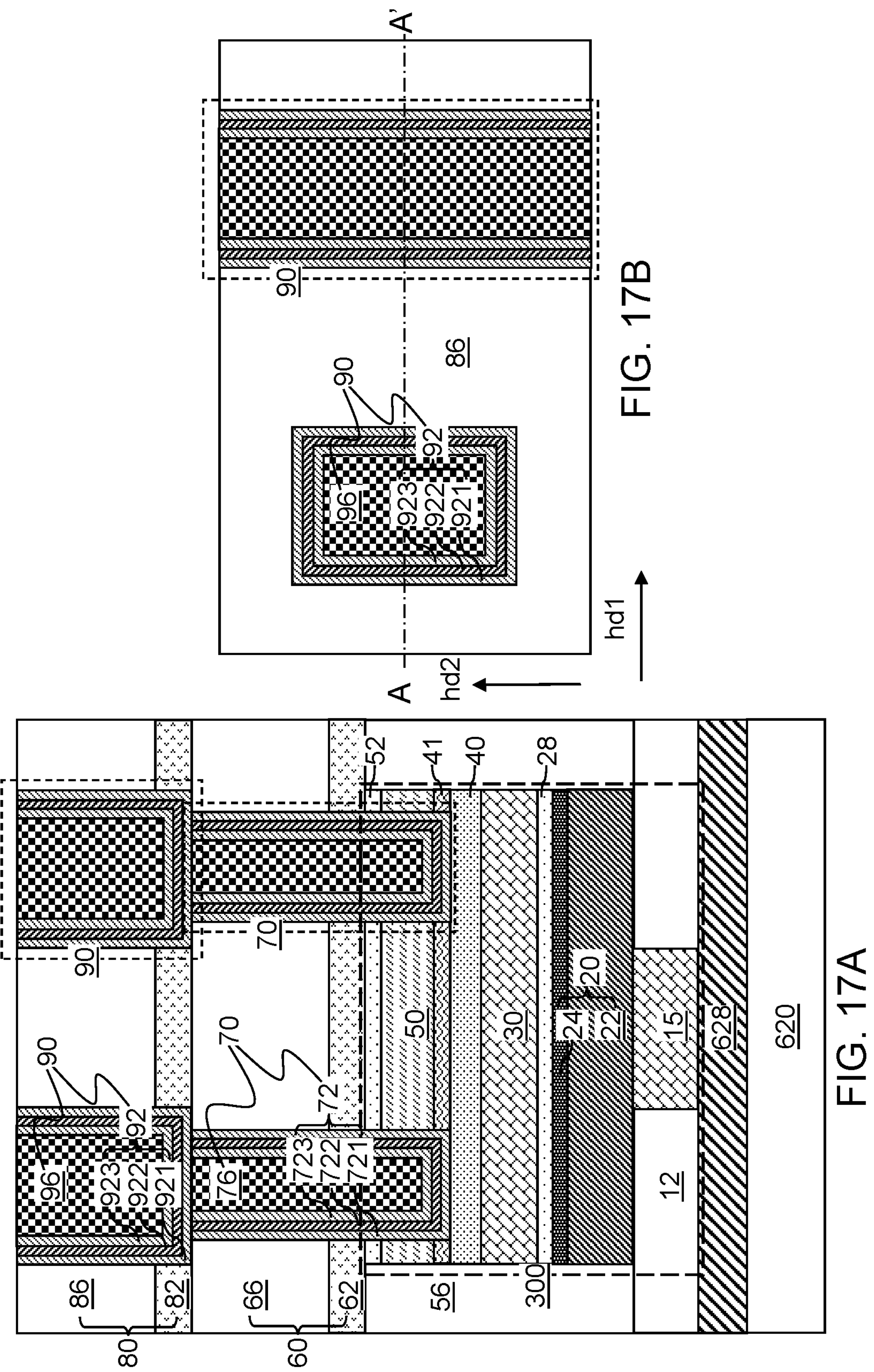
FIG. 17A is a vertical cross-sectional view of a region of a sixth alternative configuration of the first exemplary structure after formation of a line-level dielectric layer and metal lines according to an embodiment of the present disclosure.
FIG. 17B is a top-down view of the region of the first exemplary structure of FIG. 17A. The vertical plane A-A' in FIG. 17B is the cut plane of the vertical cross-sectional view of FIG. 17A.

Referring to FIGS. 17A and 17B, a sixth alternative configuration of the first exemplary structure may be derived from the fourth alternative configuration of the first exemplary structure illustrated in FIGS. 15A and 15B by omitting formation of the ferroelectric-side interfacial dielectric metal oxide layer 39.

Figures 18A, 18B:
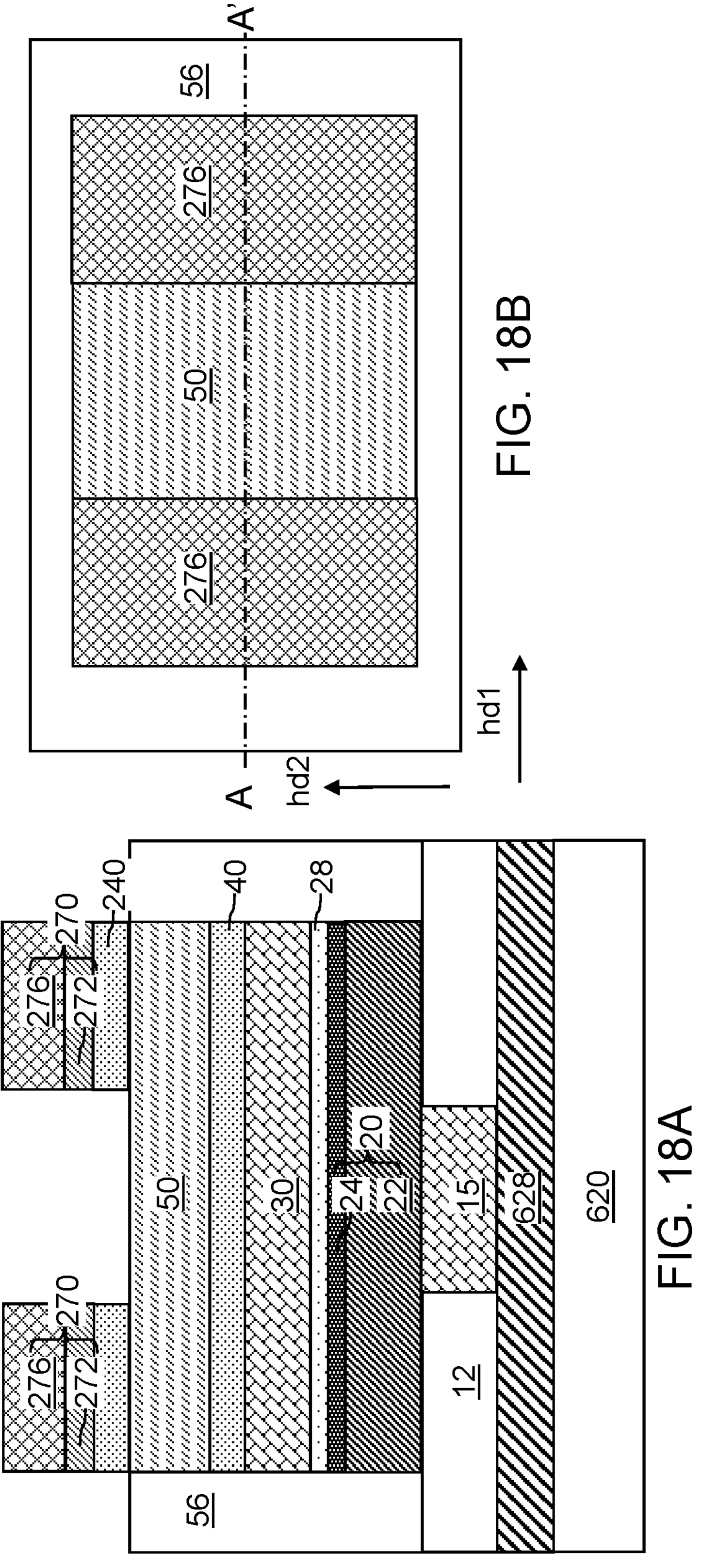
FIG. 18A is a vertical cross-sectional view of a region of a second exemplary structure according to an embodiment of the present disclosure.
FIG. 18B is a top-down view of the region of the second exemplary structure of FIG. 18A. The vertical plane A-A' in FIG. 18B is the cut plane of the vertical cross-sectional view of FIG. 18A.

Referring to FIGS. 18A and 18B, a second exemplary structure according to an embodiment of the present disclosure may be derived from the first exemplary structure illustrated in FIGS. 8A and 8B by omitting formation of the dielectric capping layer 52, and by forming stacks of an additional dielectric metal oxide layer 240 and a metallic contact structure 270. In this embodiment, the additional dielectric metal oxide layer 240 may be referred to as contact-side dielectric metal oxide layers 240. The contact-side dielectric metal oxide layers 240 may be formed using the same processing methods as the processing methods used to form the dielectric metal oxide layer 340. The contact-side dielectric metal oxide layers 240 may have the same thickness range and the material composition as the dielectric metal oxide layer 40. Each of the metallic contact structures 270 may comprise a metallic liner stack 272 and a metallic material portion 276. The metallic liner stack 272 may have the same layer composition as the metallic liner stack 72 described above. For example, each metallic liner stack 272 may comprise a first metallic barrier liner, a hydrogen-adsorbing metal liner, and a second metallic barrier liner. The metallic material portion 276 may have the same material composition as the metallic fill material portion 76 described above. Sidewalls of the metallic liner stack 272 may be vertically coincident with sidewalls of a respective overlying metallic material portion 276. Each combination of a metallic liner stack 272 and a metallic material portion 276 constitutes a metallic contact structure 270. One of the metallic contact structures 270 constitutes a source contact structure, and another of the metallic contact structures constitutes a drain contact structure.

Figures 19A, 19B:
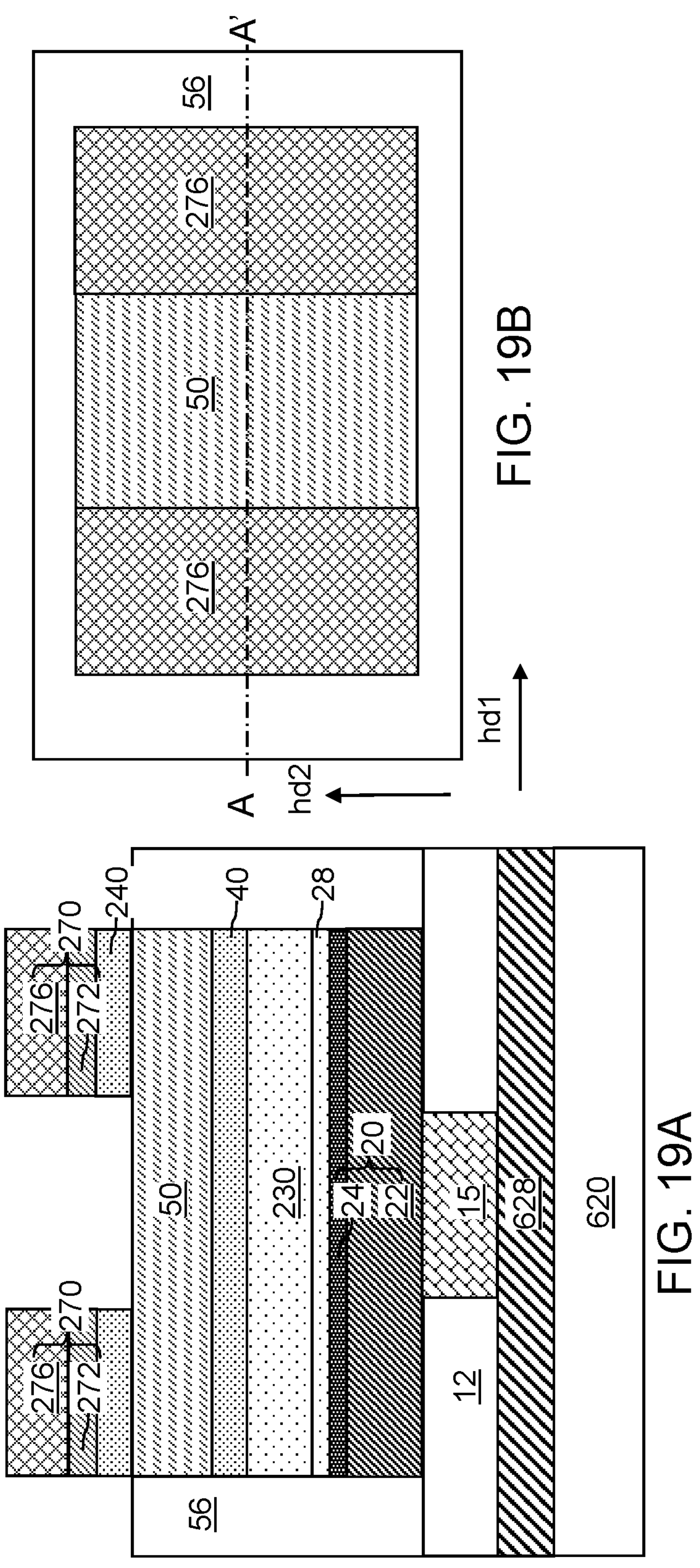
FIG. 19A is a vertical cross-sectional view of a region of a third exemplary structure according to an embodiment of the present disclosure.
FIG. 19B is a top-down view of the region of the third exemplary structure of FIG. 19A. The vertical plane A-A' in FIG. 19B is the cut plane of the vertical cross-sectional view of FIG. 19A.

Referring to FIGS. 19A and 19B, a third exemplary structure according to an embodiment of the present disclosure may be derived from the second exemplary structure by forming a gate dielectric layer 230 in lieu of a ferroelectric material layer 30. The gate dielectric layer 230 is a dielectric layer. The gate dielectric layer 230 includes a gate dielectric material, which may comprise silicon oxide, silicon nitride, or a dielectric metal oxide material. In embodiments in which the gate dielectric layer 230 comprises a dielectric metal oxide material, the dielectric metal oxide material of the gate dielectric layer 230 may, or may not, be the same as the dielectric metal oxide material of the dielectric metal oxide layer 40.

Figures 20A, 20B:
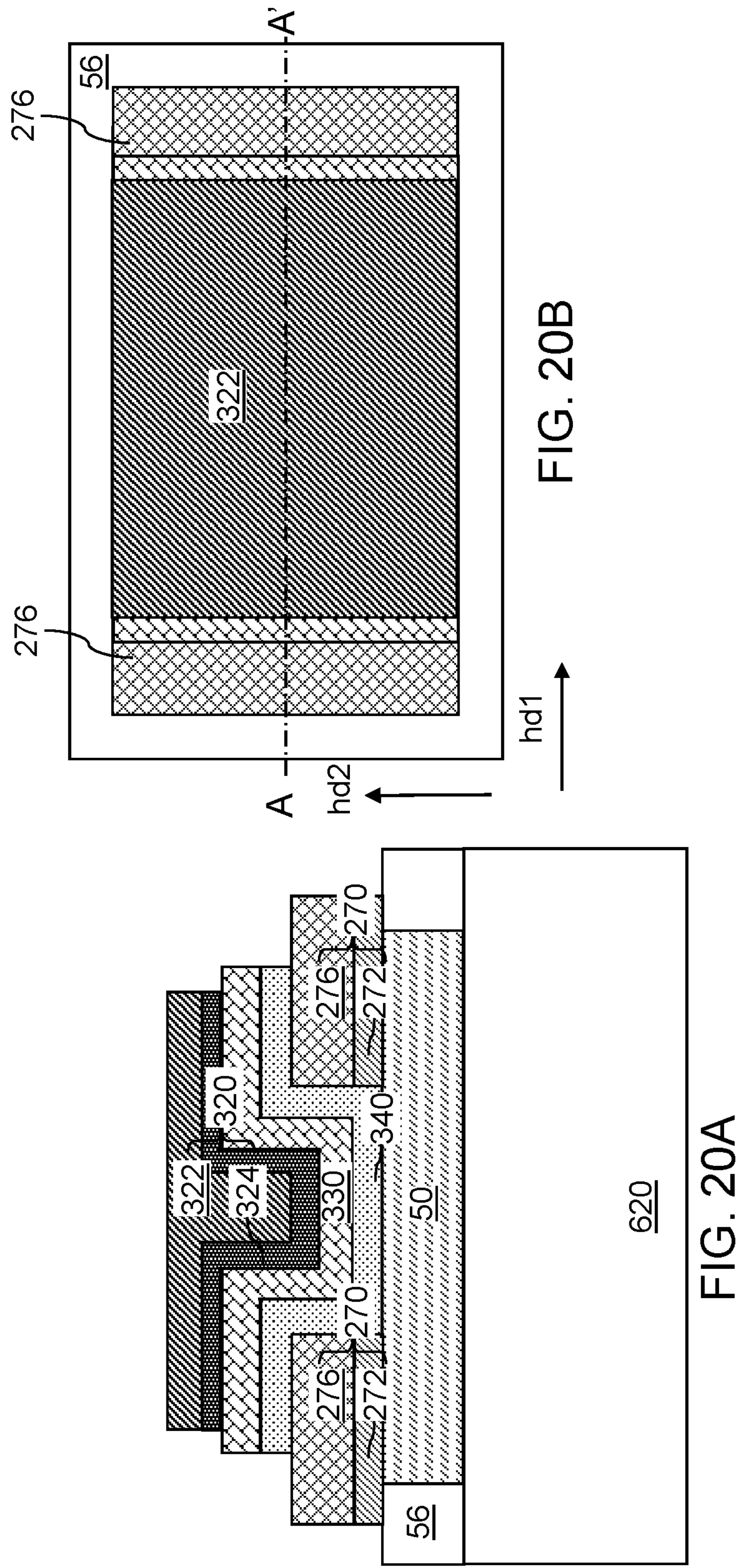
FIG. 20A is a vertical cross-sectional view of a region of a fourth exemplary structure according to an embodiment of the present disclosure.
FIG. 20B is a top-down view of the region of the fourth exemplary structure of FIG. 20A. The vertical plane A-A' in FIG. 20B is the cut plane of the vertical cross-sectional view of FIG. 20A.

Referring to FIGS. 20A and 20B, a fourth exemplary structure according to an embodiment of the present disclosure may be derived from the first exemplary structure by omitting formation of a connection-via-level dielectric layer 12, a connection via structure 15, a bottom electrode 20, a seed layer, a ferroelectric material layer, and a dielectric metal oxide layer 40, by forming the semiconductor layer 50, by forming the stacks of a contact-side dielectric metal oxide layer 240 and a metallic contact structure 270 described with reference to FIGS. 18A and 18B, by forming an upper-gate dielectric metal oxide layer 340 have a same material composition and a same thickness range as the dielectric metal oxide layer 40 described above, by forming a ferroelectric material layer 330 having a same material composition as a ferroelectric material layer 30 described above, and by forming a top gate electrode 320. The top gate electrode 320 may comprise a stack of a metallic barrier layer 324 and a primary metal layer 322. The metallic barrier layer 324 may have the same material composition as the metallic barrier capping layer 24 described above, and the primary metal layer 322 may have the same material composition as the primary metal layer 22 described above. The metallic contact structures 270 may function as a source electrode and a drain electrode.

Figures 21A, 21B:
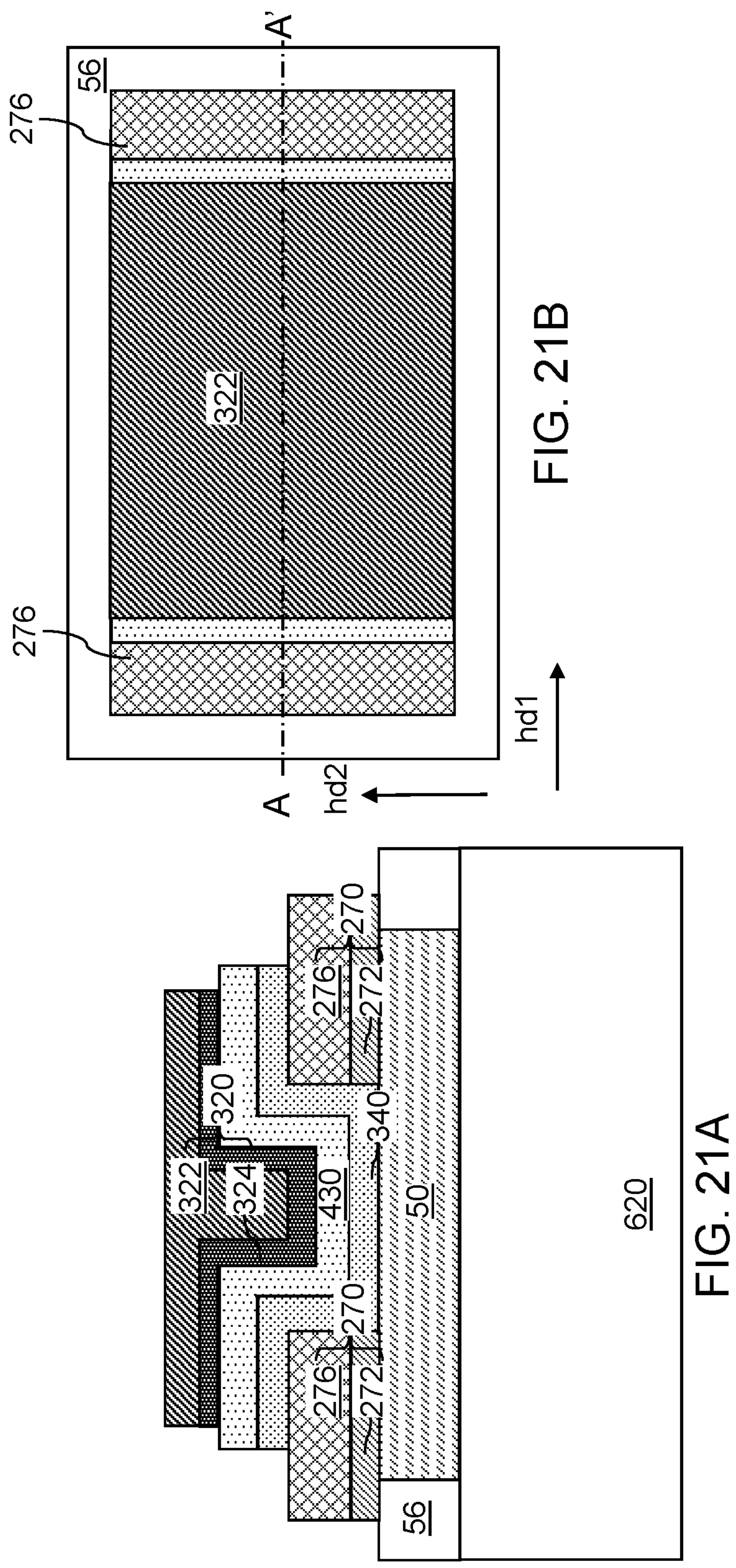
FIG. 21A is a vertical cross-sectional view of a region of a fifth exemplary structure according to an embodiment of the present disclosure.
FIG. 21B is a top-down view of the region of the fifth exemplary structure of FIG. 21A. The vertical plane A-A' in FIG. 21B is the cut plane of the vertical cross-sectional view of FIG. 21A.

Referring to FIGS. 21A and 21B, a fifth exemplary structure according to an embodiment of the present disclosure may be derived from the fourth exemplary structure by forming a gate dielectric layer 430 in lieu of a ferroelectric material layer 330. The gate dielectric layer 430 is a dielectric layer. The gate dielectric layer 430 includes a gate dielectric material, which may comprise silicon oxide, silicon nitride, or a dielectric metal oxide material. In embodiments in which the gate dielectric layer 430 comprises a dielectric metal oxide material, the dielectric metal oxide material of the gate dielectric layer 430 may, or may not, be the same as the dielectric metal oxide material of the dielectric metal oxide layer 340.

Figures 22A, 22B:
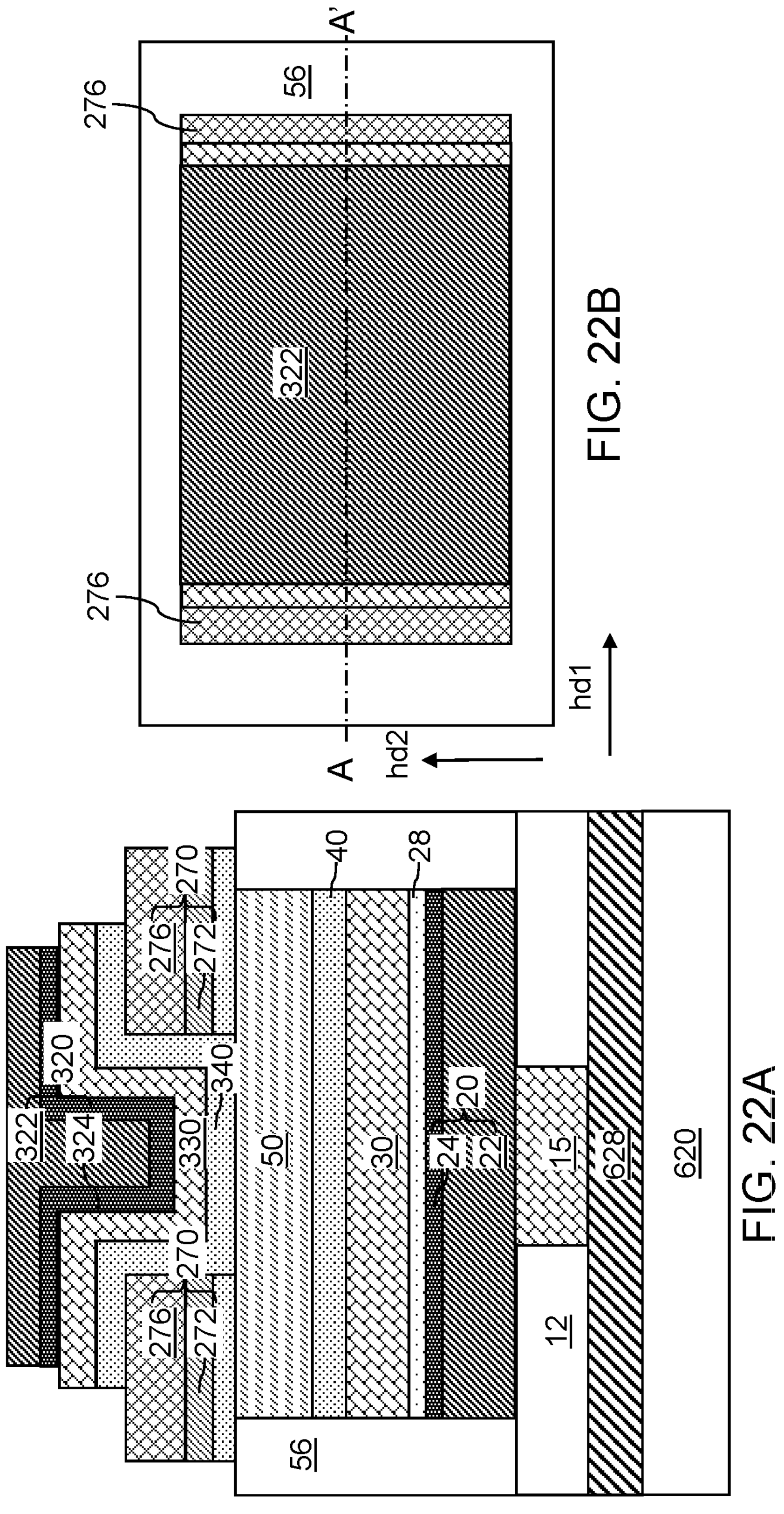
FIG. 22A is a vertical cross-sectional view of a region of a sixth exemplary structure according to an embodiment of the present disclosure.
FIG. 22B is a top-down view of the region of the sixth exemplary structure of FIG. 22A. The vertical plane A-A' in FIG. 22B is the cut plane of the vertical cross-sectional view of FIG. 22A.

Referring to FIGS. 22A and 22B, a sixth exemplary structure according to an embodiment of the present disclosure may be derived from the second exemplary structure illustrated in FIGS. 18A and 18B by forming an upper-gate dielectric metal oxide layer 340, a ferroelectric material layer 330, and a top gate electrode 320 as disclosed with reference to FIGS. 20A and 20B. In this embodiment, a dual gate ferroelectric field effect transistor can be provided. The ferroelectric material layer 30 is referred to as a bottom ferroelectric material layer 30 in this case.

Figures 23A, 23B:
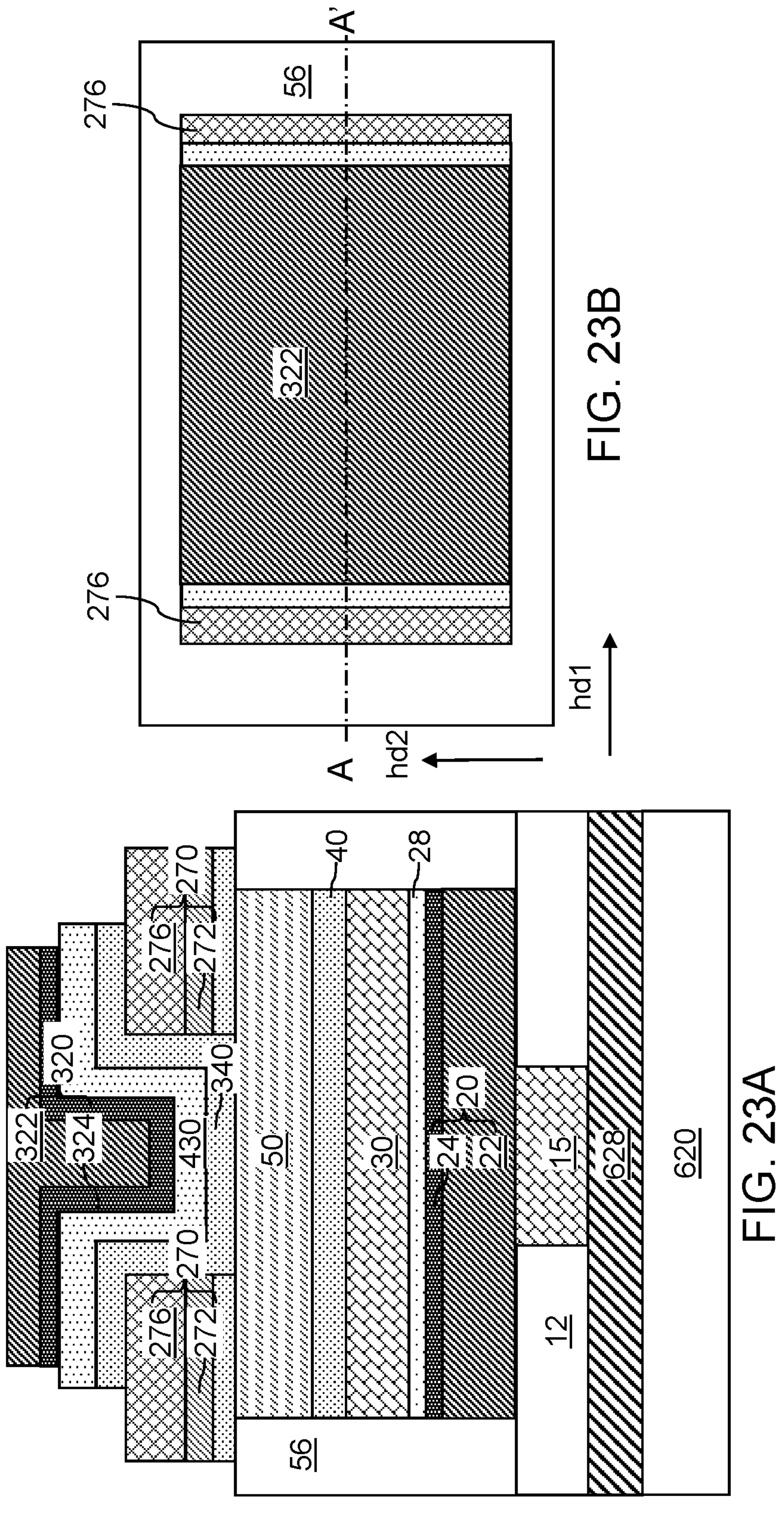
FIG. 23A is a vertical cross-sectional view of a region of a seventh exemplary structure according to an embodiment of the present disclosure.
FIG. 23B is a top-down view of the region of the seventh exemplary structure of FIG. 23A. The vertical plane A-A' in FIG. 23B is the cut plane of the vertical cross-sectional view of FIG. 23A.

Referring to FIGS. 23A and 23B, a seventh exemplary structure according to an embodiment of the present disclosure may be derived from the third exemplary structure by forming a gate dielectric layer 430 in lieu of a ferroelectric material layer 330. The gate dielectric layer 430 includes a gate dielectric material, which may comprise silicon oxide, silicon nitride, or a dielectric metal oxide material. In embodiments in which the gate dielectric layer 430 comprises a dielectric metal oxide material, the dielectric metal oxide material of the gate dielectric layer 430 may, or may not, be the same as the dielectric metal oxide material of the dielectric metal oxide layer 340.

Figures 24, 25:
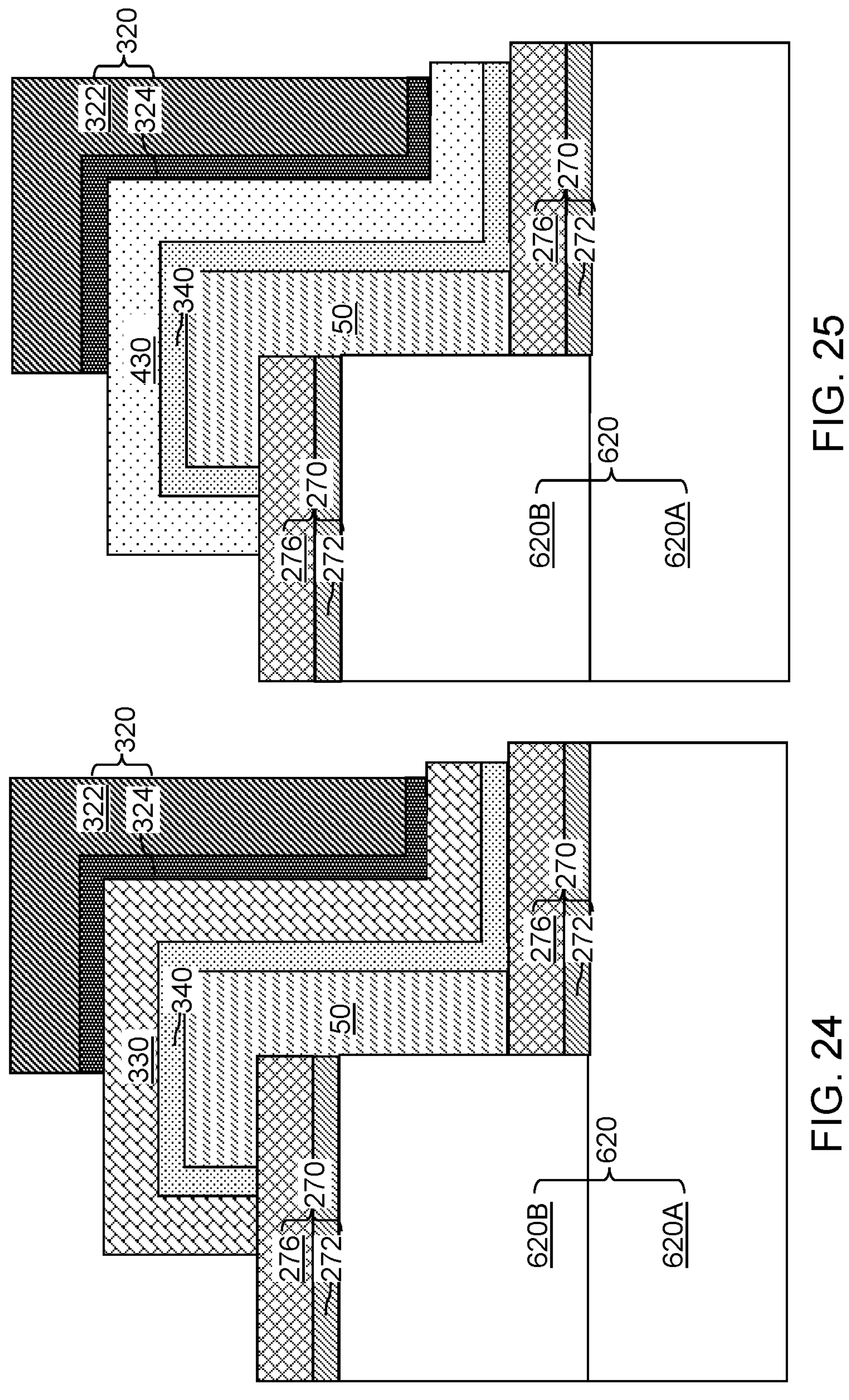
FIG. 24 is a vertical cross-sectional view of a region of an eighth exemplary structure according to an embodiment of the present disclosure.
FIG. 25 is a vertical cross-sectional view of a region of a ninth exemplary structure according to an embodiment of the present disclosure.

Referring to FIG. 24, an eighth exemplary structure according to an embodiment of the present disclosure may be derived from the fourth exemplary structure illustrated in FIGS. 20A and 20B by forming the semiconductor layer 50 as a vertical semiconductor channel. For example, the second interconnect-level dielectric material layer 620 may be formed as a stepped structure including a lower second interconnect-level dielectric material sublayer 620A and an upper second interconnect-level dielectric material sublayer 620B. The height of the vertical step may be the same as the thickness of the upper second interconnect-level dielectric material sublayer 620B. A first metallic contact structure 270 may be formed at the bottom of a vertical step defined by a sidewall of the upper second interconnect-level dielectric material sublayer 620B, and a second metallic contact structure 270 can be formed at the top of the vertical step. Subsequently, a semiconductor layer 50, a ferroelectric material layer 330, and a top gate electrode 320 may be sequentially formed over the sidewall of the upper second interconnect-level dielectric material sublayer 620B. The top gate electrode 320 may comprise a stack of a metallic barrier layer 324 and a primary metal layer 322.

Referring to FIG. 25, a ninth exemplary structure according to an embodiment of the present disclosure may be derived from the eighth exemplary structure by forming a gate dielectric layer 430 in lieu of a ferroelectric material layer 330. The gate dielectric layer 430 includes a gate dielectric material, which may comprise silicon oxide, silicon nitride, or a dielectric metal oxide material. In embodiments in which the gate dielectric layer 430 comprises a dielectric metal oxide material, the dielectric metal oxide material of the gate dielectric layer 430 may, or may not, be the same as the dielectric metal oxide material of the dielectric metal oxide layer 340.

Figure 26:
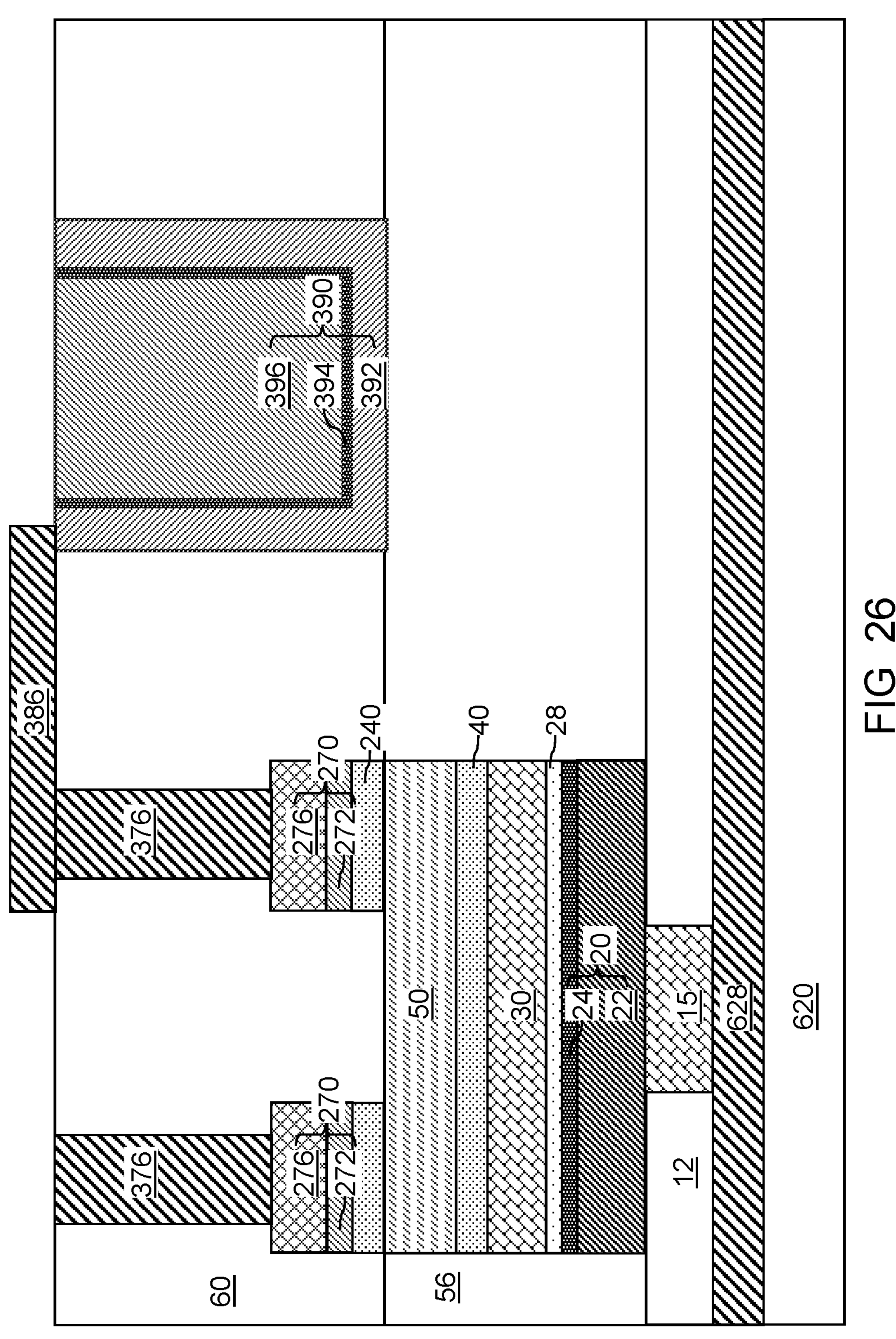
FIG. 26 is a vertical cross-sectional view of a region of a tenth exemplary structure according to an embodiment of the present disclosure.

Referring to FIG. 26, a tenth exemplary structure according to an embodiment of the present disclosure may be derived from any of the previously described exemplary structures by connecting a capacitor 390 to one of the metallic contact structures such as a second metallic contact structure 270 that functions as a drain electrode. In this embodiment, metal via structures 376 and a metal line structure 386 may be employed to provide the electrical connection. The tenth exemplary structure may function as a dynamic random access memory cell including, or not including, a ferroelectric material layer 30.

Figure 27B:
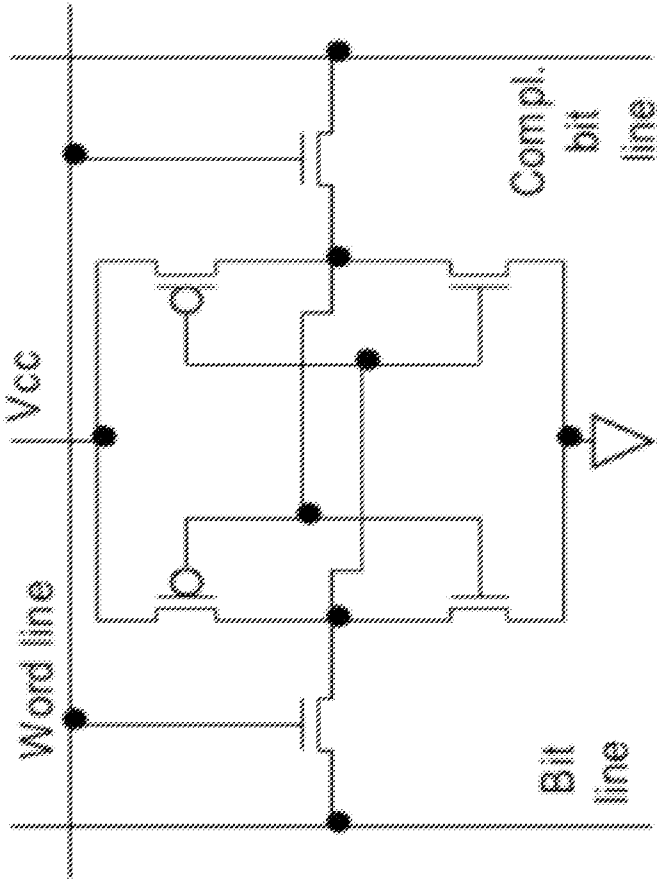
FIG. 27B is a circuit schematic for a static random access memory cell employing transistors of the present disclosure.
Figure 27A:
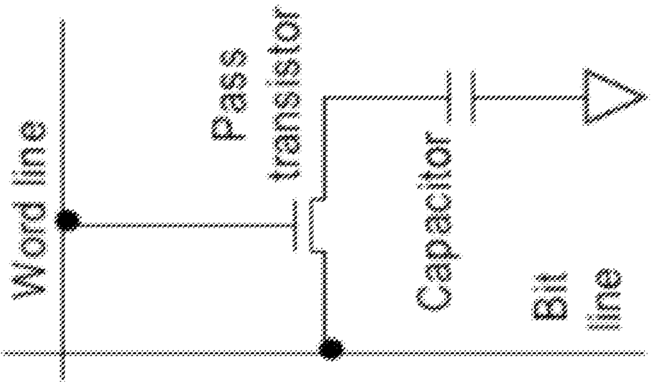
FIG. 27A is a circuit schematic for a dynamic random access memory cell employing a transistor of the present disclosure.
Figure 27C:
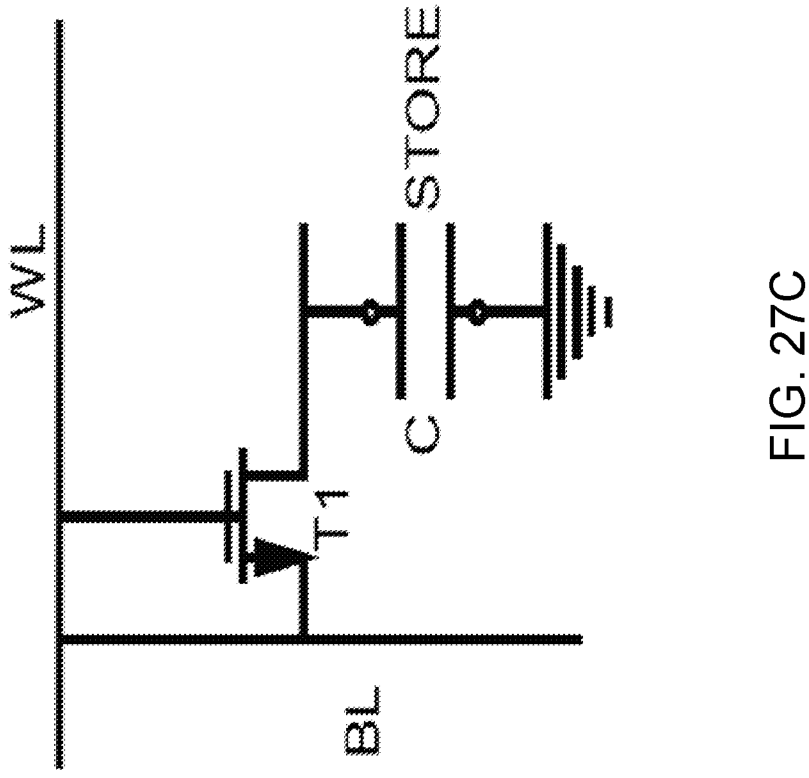
FIG. 27C is a circuit schematic for a ferroelectric capacitor memory cell employing a transistor of the present disclosure.

Generally speaking, many types of devices may be provided using any of the previously described exemplary structures. FIG. 27A is a circuit schematic for a dynamic random access memory cell employing a transistor of the present disclosure. FIG. 27B is a circuit schematic for a static random access memory cell employing transistors of the present disclosure. FIG. 27C is a circuit schematic for a ferroelectric capacitor memory cell employing a transistor of the present disclosure. One or more of the field effect transistors in the circuits of FIGS. 27A-27C may include any of the previously described field effect transistors of the present disclosure.

Figure 28:
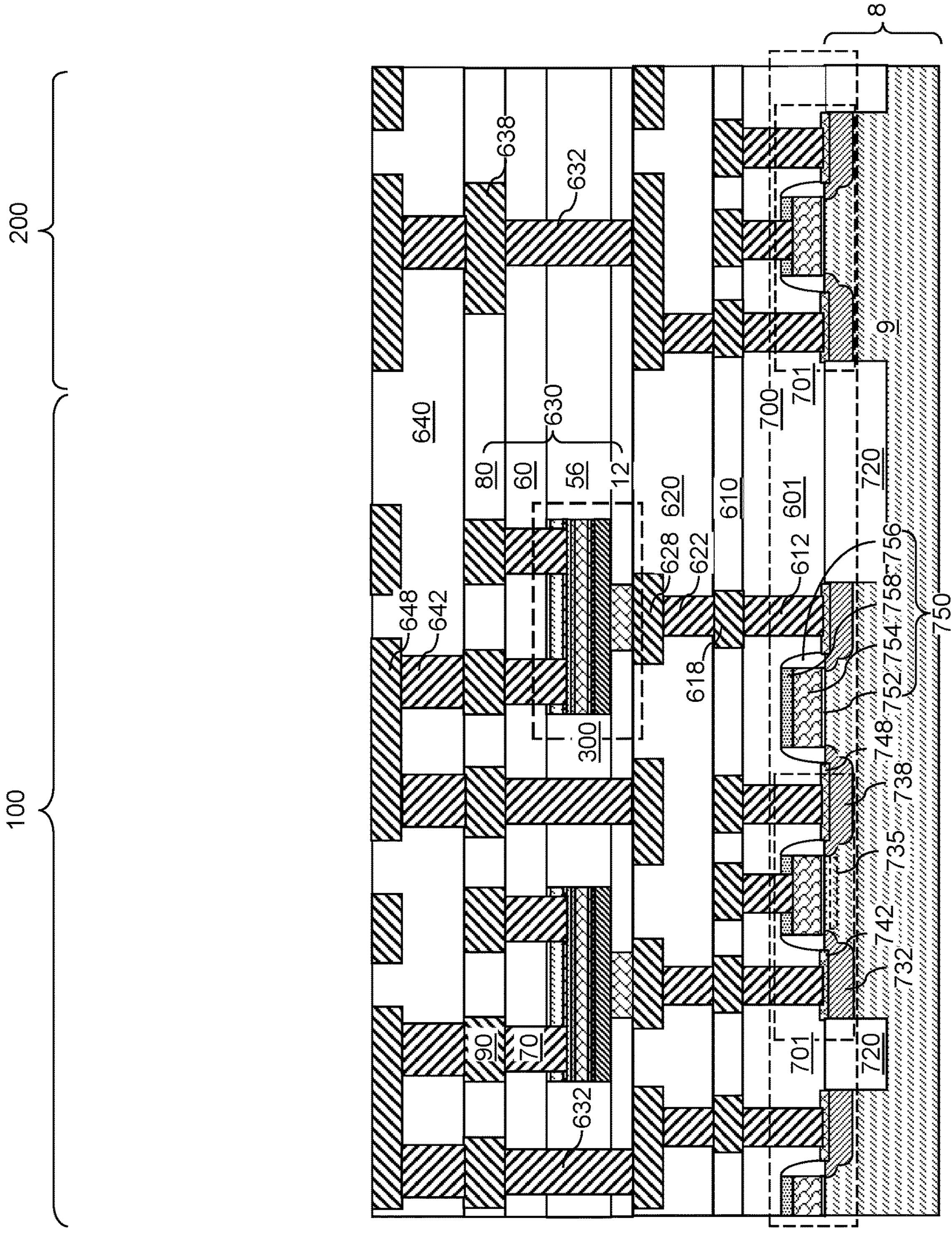
FIG. 28 is a vertical cross-sectional view of an exemplary structure after formation of second metal interconnect structures embedded within second dielectric material layers according to an embodiment of the present disclosure.

Referring to FIG. 28, an exemplary structure (or any alternative configuration thereof) is illustrated after formation of additional dielectric material layers and additional metal interconnect structures. The exemplary structure may be derived from any of the above exemplary structures. Second metal via structures 632 may be formed through the via-level dielectric layer 60, the memory-level dielectric layer 56, and the connection-via-level dielectric layer 12 on a respective one of the second metal line structures 628 at the processing steps described with reference to FIGS. 9A, 9B, 10A, and 10B concurrently with formation of the metallic contact structures 70. Each of the second metal via structures 632 may include a same set of materials as each of the metallic contact structures 70. Third metal line structures 638 may be formed in the line-level dielectric layer 80 concurrently at the processing steps described with reference to FIGS. 11A and 11B with formation of the metal lines 90. The combination of the line-level dielectric layer 80, the via-level dielectric layer 60, the memory-level dielectric layer 56, and the connection-via-level dielectric layer 12 constitutes a third interconnect-level dielectric material layer 630.

A fourth interconnect-level dielectric material layer 640 may be formed above the third interconnect-level dielectric material layer 630, and third metal via structures 642 and fourth metal line structures 648 may be formed in the fourth interconnect-level dielectric material layer 640. Additional interconnect-level dielectric material layers (not shown) and additional metal interconnect structures (not shown) may be formed above the fourth interconnect-level dielectric material layer 640. The set of all dielectric material layers that is formed above the top surface of the third interconnect-level dielectric material layer 630 is herein referred to as second dielectric material layers, and the set of all metal interconnect structures that is formed above the top surface of the third interconnect-level dielectric material layer 630 is herein referred to as second metal interconnect structures. Generally, the second metal interconnect structures may be embedded within the second dielectric material layers, and may be used to provide electrical connection between the ferroelectric devices 300 and the CMOS circuitry 700 through the metal lines 80, the third metal line structures, and the first metal interconnect structures (612, 618, 622, 628).

Figure 29:
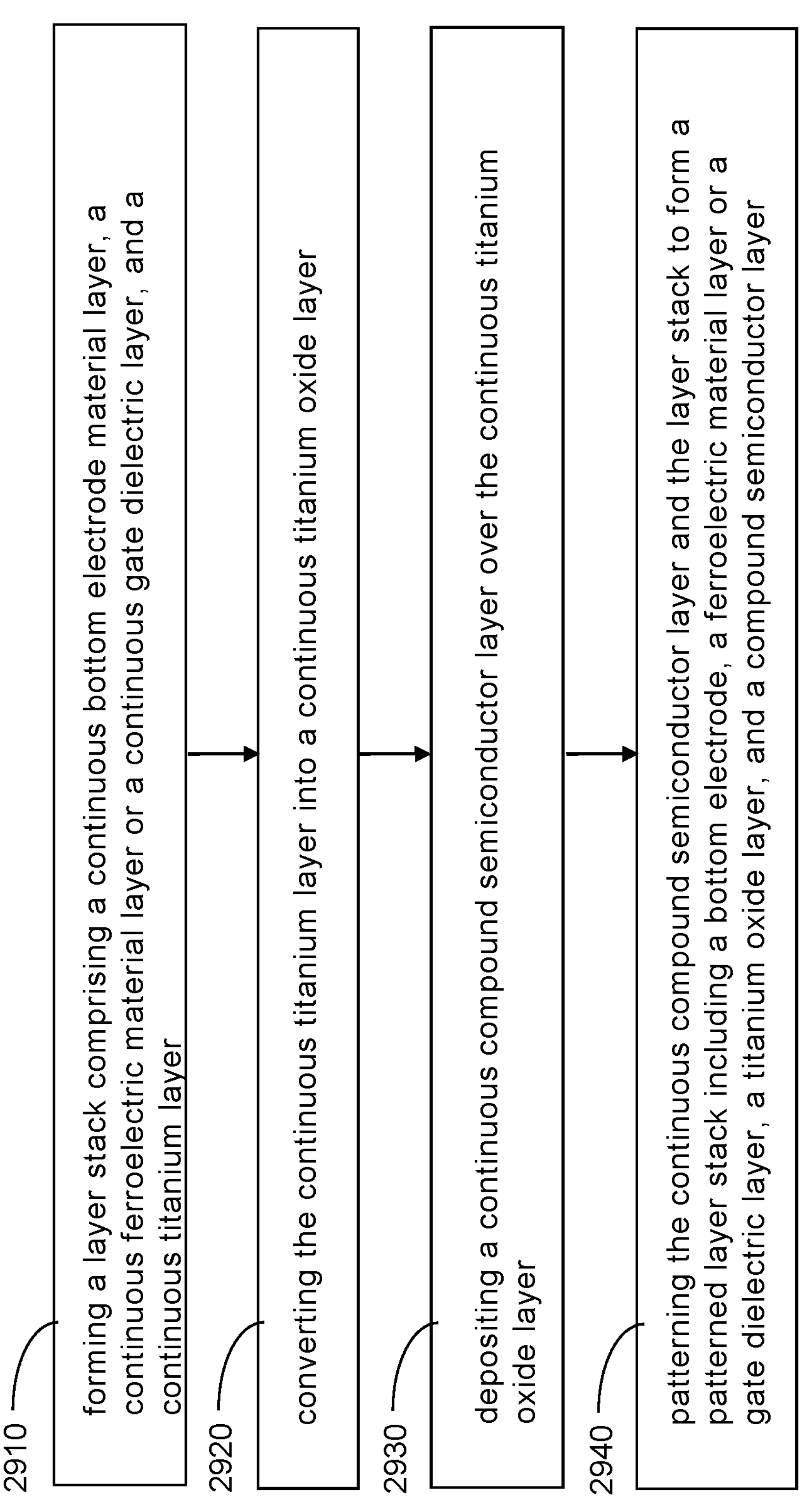
FIG. 29 is a first flow chart illustrating a set of processing steps for implementing the methods of an embodiment of the present disclosure.

FIG. 29 is a first flow chart illustrating a set of processing steps for implementing the methods of an embodiment of the present disclosure.

Referring to step 2910 and FIGS. 1-3B, a layer stack comprising a continuous bottom electrode material layer 20L, a continuous ferroelectric material layer 30L or a continuous gate dielectric layer, and a continuous metal layer 140L may be formed over a substrate 8.

Referring to step 2920 and FIGS. 4A-5C, the continuous metal layer 140L may be converted into a continuous dielectric metal oxide layer 40L.

Referring to step 2930 and FIGS. 6A and 6B and 18A-26, a continuous semiconductor layer 50L may be deposited over the continuous dielectric metal oxide layer 40L.

Referring to step 2940 and FIGS. 7A-26, the continuous semiconductor layer 50L and the layer stack may be patterned to form a patterned layer stack (20, 28, 30, 40, 50, 52) including a bottom electrode 20, a ferroelectric material layer 30, a dielectric metal oxide layer 40, and a semiconductor layer 50.

Figure 30:
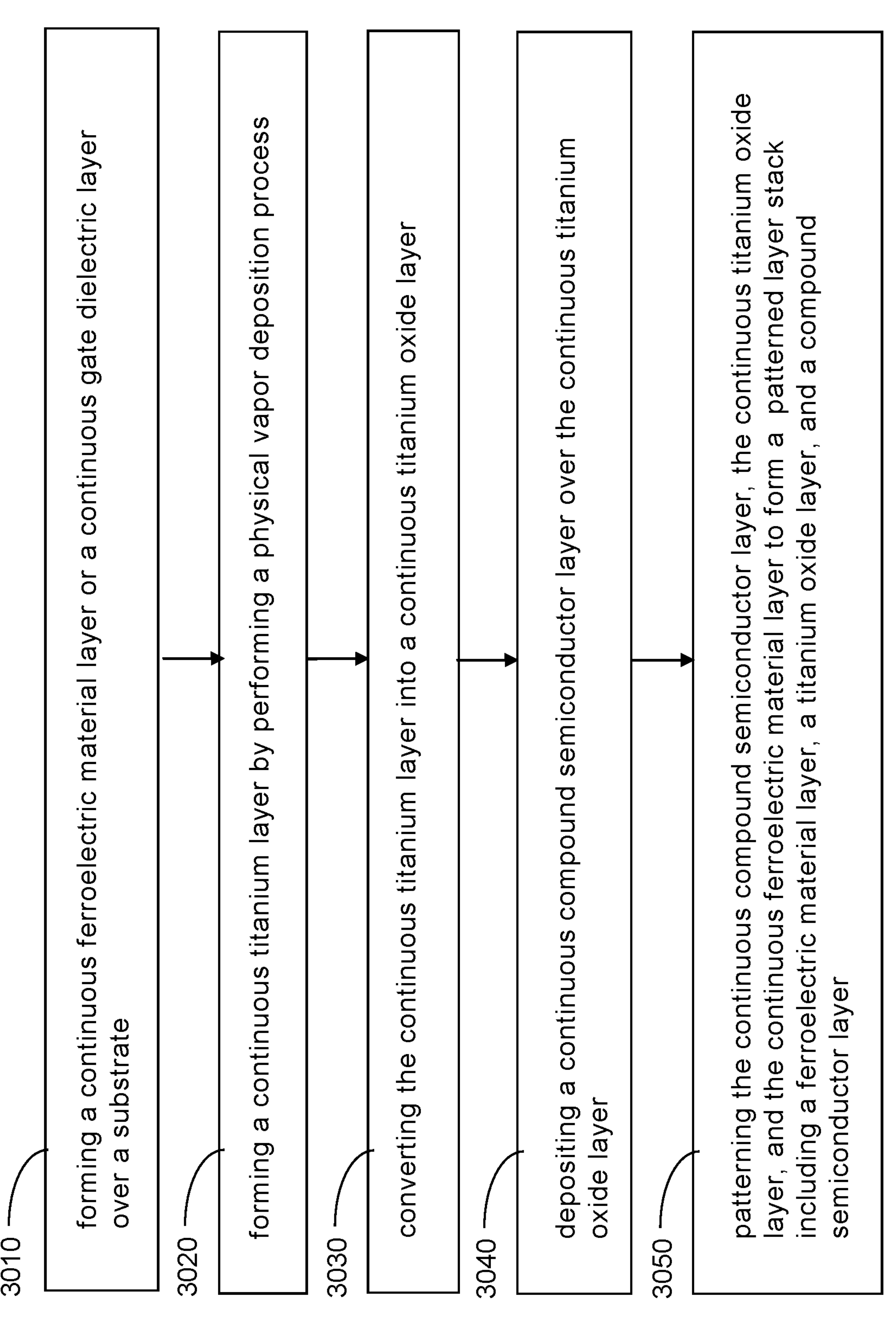
FIG. 30 is a second flow chart illustrating a set of processing steps for implementing the methods of an embodiment of the present disclosure.

FIG. 30 is a second flow chart illustrating a set of processing steps for implementing the methods of an embodiment of the present disclosure.

Referring to step 3010 and FIGS. 1-3B, a continuous ferroelectric material layer 30L or a continuous gate dielectric layer may be formed over a substrate 8.

Referring to step 3020 and FIGS. 3A and 3B, a continuous dielectric metal oxide layer 40L may be formed by performing a physical vapor deposition process.

Referring to step 3030 and FIGS. 4A-5C, the continuous metal layer 140L may be converted into a continuous dielectric metal oxide layer 40L.

Referring to step 3040 and FIGS. 6A and 6B and 18A-26, a continuous semiconductor layer 50L may be deposited over the continuous dielectric metal oxide layer 40L.

Referring to step 3050 and FIGS. 7A-26, the continuous semiconductor layer 50L, the continuous dielectric metal oxide layer 40L, and the continuous ferroelectric material layer 30L may be patterned to form a patterned layer stack (20, 28, 30, 40, 50, 52) including a ferroelectric material layer 30, a dielectric metal oxide layer 40, and a semiconductor layer 50.

Figure 31:
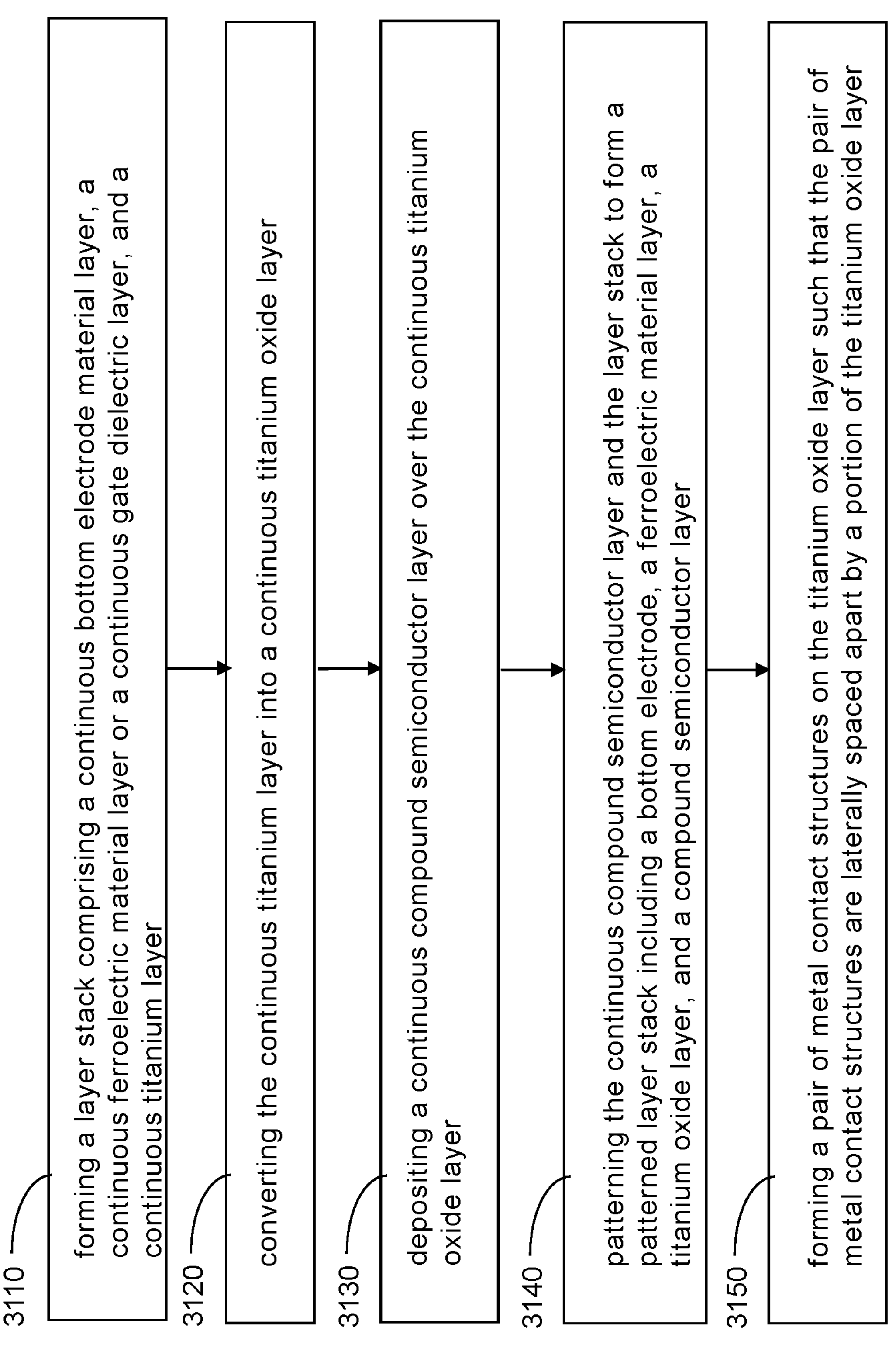
FIG. 31 is a third flow chart illustrating a set of processing steps for implementing the methods of an embodiment of the present disclosure.

FIG. 31 is a third flow chart illustrating a set of processing steps for implementing the methods of an embodiment of the present disclosure.

Referring to step 3110 and FIGS. 1-3B, a layer stack comprising a continuous bottom electrode material layer 20L, a continuous ferroelectric material layer 30L or a continuous gate dielectric layer, and a continuous dielectric metal oxide layer 40L may be formed over a substrate 8.

Referring to step 3120 and FIGS. 4A-5C, the continuous metal layer 140L may be converted into a continuous dielectric metal oxide layer 40L.

Referring to step 3130 and FIGS. 6A and 6B, a continuous semiconductor layer 50L may be deposited over the continuous dielectric metal oxide layer 40L.

Referring to step 3140 and FIGS. 7A and 7B and 18A-26, the continuous semiconductor layer 50L and the layer stack (20L, 28L, 30L, 40L) may be patterned to form a patterned layer stack (20, 28, 30, 40, 50, 52) including a bottom electrode 20, a ferroelectric material layer 30, a dielectric metal oxide layer 40, and a semiconductor layer 50.

Referring to step 3150 and FIGS. 8A-26, a pair of metallic contact structures 70 may be formed on the dielectric metal oxide layer 40 such that the pair of metallic contact structures 70 are laterally spaced apart by a portion of the dielectric metal oxide layer 40.

The various embodiments of the present disclosure may be used to provide an interfacial structure between a ferroelectric material layer 30 and a semiconductor layer 50 that includes at least a dielectric metal oxide layer 40 that reduces interfacial defects and increases the reliability of a ferroelectric device 300. The dielectric metal oxide layer 40 may be formed by a combination of a physical deposition process that deposits metallic titanium and a subsequent oxidation process, which may provide high throughput in a high-volume manufacturing process.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph or in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a device structure, the method comprising:

forming a layer stack comprising a continuous bottom electrode material layer, a continuous dielectric layer, and a continuous metal layer;

converting the continuous metal layer into a continuous dielectric metal oxide layer;

depositing a continuous semiconductor layer over the continuous dielectric metal oxide layer; and patterning the continuous semiconductor layer and the layer stack to form a patterned layer stack including a bottom electrode, a dielectric layer, a dielectric metal oxide layer, and a semiconductor layer, wherein:

the continuous bottom electrode material layer comprises a layer stack including, from bottom to top, a continuous primary metal layer and a continuous metallic barrier capping layer having a higher electrical resistivity than the continuous primary metal layer; and the continuous metallic barrier capping layer comprises a material selected from Ti, Ta, W, Mo, TiN, TaN, WN, MON, TiC, TaC, or WC.

2. The method of claim 1, further comprising forming a pair of metallic contact structures through the semiconductor layer such that the pair of metallic contact structures are laterally spaced from each other by a portion of the semiconductor layer.

3. The method of claim 1, wherein converting the continuous metal layer into the continuous dielectric metal oxide layer comprises performing a thermal anneal in an oxidizing ambient.

4. The method of claim 1, wherein converting the continuous metal layer into the continuous dielectric metal oxide layer comprises performing an ozonated deionized water treatment process.

5. The method of claim 1, wherein converting the continuous metal layer into the continuous dielectric metal oxide layer comprises performing a direct ozone plasma treatment.

6. The method of claim 1, wherein the continuous dielectric layer comprises a doped hafnium oxide layer that is doped with at least one dopant species that is selected from Al, In, Si, Ge, alkaline earth metals, transition metals, or rare-earth metals.

7. The method of claim 1, wherein the layer stack comprises a continuous seed layer that overlies the continuous bottom electrode material layer and underlies the continuous dielectric layer.

8. The method of claim 1, further comprising:
depositing a continuous dielectric capping layer over the continuous semiconductor layer; and
patterning the continuous dielectric capping layer into a dielectric capping layer.

9. The method of claim 1, further comprising:
forming field effect transistors over a substrate;
forming first metal interconnect structures embedded in first dielectric material layers and electrically connected to a respective node of the field effect transistors;
forming a connection-via-level dielectric layer over the first metal interconnect structures; and
forming a connection via structure contacting a top surface of one of the first metal interconnect structures in the connection-via-level dielectric layer, wherein the bottom electrode is formed on a top surface of the connection via structure.

10. A method of forming a device structure, the method comprising:
forming a continuous dielectric layer over a substrate;
forming a continuous metal layer by performing a physical vapor deposition process;
converting the continuous metal layer into a continuous dielectric metal oxide layer by performing a thermal anneal in an oxidizing ambient, performing an ozonated deionized water treatment process, or performing a direct ozone plasma treatment;
depositing a continuous semiconductor layer over the continuous dielectric metal oxide layer; and
patterning the continuous semiconductor layer, the continuous dielectric metal oxide layer, and the continuous dielectric layer to form a patterned layer stack including a dielectric layer, a dielectric metal oxide layer, and a semiconductor layer.

11. The method of claim 10, further comprising forming a pair of metallic contact structures through the semiconductor layer such that the pair of metallic contact structures are laterally spaced from each other by a portion of the semiconductor layer.

12. The method of claim 10, wherein converting the continuous metal layer into the continuous dielectric metal oxide layer comprises performing a thermal anneal in an oxidizing ambient at an elevated temperature in a range from 200 degrees Celsius to 400 degrees Celsius.

13. The method of claim 10, wherein converting the continuous metal layer into the continuous dielectric metal oxide layer comprises performing an ozonated deionized water treatment process for a duration in a range from 60 seconds to 600 seconds.

14. The method of claim 10, wherein converting the continuous metal layer into the continuous dielectric metal oxide layer comprises performing a direct ozone plasma treatment in a plasma process chamber.

15. A method of forming a device structure, the method comprising:
forming a layer stack comprising a continuous bottom electrode material layer, a continuous dielectric layer, and a continuous metal layer;
converting the continuous metal layer into a continuous dielectric metal oxide layer;
depositing a continuous semiconductor layer over the continuous dielectric metal oxide layer;
patterning the continuous semiconductor layer and the layer stack to form a patterned layer stack including a bottom electrode, a dielectric layer, a dielectric metal oxide layer, and a semiconductor layer; and
forming a pair of metallic contact structures on the dielectric metal oxide layer by etching a pair of via cavities through the semiconductor layer such that bottom surfaces of the pair of via cavities are formed on a top surface of the dielectric metal oxide layer, within the dielectric metal oxide layer, or on a top surface of the dielectric layer, wherein the pair of metallic contact structures are laterally spaced apart by a portion of the dielectric metal oxide layer.

16. The method of claim 15, further comprising:
forming a memory-level dielectric layer around the patterned layer stack; and
forming via-level dielectric layer over the patterned layer stack and the memory-level dielectric layer, wherein the pair of metallic contact structures are formed through the via-level dielectric layer.

17. The method of claim 16, further comprising:
forming a pair of via cavities through the via-level dielectric layer and the semiconductor layer; and
depositing at least one metallic material in the pair of via cavities and removing excess portions of the at least one metallic material from outside the pair of via cavities, wherein remaining portions of the at least one metallic material filling the pair of via cavities constitute the pair of metallic contact structures.

18. The method of claim 15, further comprising:
depositing at least one continuous interfacial dielectric metal oxide layer over the continuous dielectric layer prior to, or after, formation of the continuous dielectric metal oxide layer; and
increasing an oxygen-to-metal ratio in the at least one continuous interfacial dielectric metal oxide layer by incorporating additional oxygen atoms into the at least one continuous interfacial dielectric meal oxide layer.

19. The method of claim 10, wherein the continuous semiconductor layer is deposited on a top surface of the continuous dielectric metal oxide layer.

20. The method of claim 10, wherein:
the layer stack further comprises a continuous bottom electrode material layer underlying the continuous dielectric layer;
the continuous bottom electrode material layer comprises a layer stack including, from bottom to top, a continuous primary metal layer and a continuous metallic barrier capping layer having a higher electrical resistivity than the continuous primary metal layer; and
the continuous metallic barrier capping layer comprises a material selected from Ti, Ta, W, Mo, TiN, TaN, WN, MON, TIC, TaC, or WC.

* * * * *